(12) United States Patent
Makurin et al.

(10) Patent No.: US 11,277,123 B2
(45) Date of Patent: Mar. 15, 2022

(54) METHOD FOR CONTROLLING TRANSMISSION OF ELECTROMAGNETIC WAVE ON BASIS OF LIGHT, AND DEVICE THEREFOR

(71) Applicant: SAMSUNG ELECTRONICS CO., LTD., Suwon-si (KR)

(72) Inventors: Mikhail Nikolaevich Makurin, Moscow (RU); Anton Sergeevich Lukyanov, Moscow (RU); Elena Aleksandrovna Shepeleva, Kostroma (RU); Artem Yurievich Nikishov, Moscow (RU); Artem Rudolfovich Vilenskiy, Moscow (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/048,139

(22) PCT Filed: May 21, 2019

(86) PCT No.: PCT/KR2019/006063
§ 371 (c)(1),
(2) Date: Oct. 16, 2020

(87) PCT Pub. No.: WO2019/225945
PCT Pub. Date: Nov. 28, 2019

(65) Prior Publication Data
US 2021/0167764 A1 Jun. 3, 2021

(30) Foreign Application Priority Data
May 21, 2018 (RU) .......................... RU2018118601

(51) Int. Cl.
*H03K 5/01* (2006.01)
*H03H 7/38* (2006.01)
(Continued)

(52) U.S. Cl.
CPC .................. *H03K 5/01* (2013.01); *H03H 7/38* (2013.01); *H05K 1/024* (2013.01); *H05K 1/115* (2013.01); *H03K 2005/00286* (2013.01)

(58) Field of Classification Search
None
See application file for complete search history.

(56) References Cited

U.S. PATENT DOCUMENTS

| 3,678,414 | A | 7/1972 | Hallford |
| 4,070,619 | A | 1/1978 | Trefney |
(Continued)

FOREIGN PATENT DOCUMENTS

| CN | 102323680 A | 1/2012 |
| EP | 0 797 268 A2 | 9/1997 |
(Continued)

OTHER PUBLICATIONS

Communication dated May 11, 2021, from The China National Intellectual Property Administration in Application No. 201980034263.5.

(Continued)

*Primary Examiner* — Cassandra F Cox
(74) *Attorney, Agent, or Firm* — Sughrue Mion, PLLC

(57) ABSTRACT

A device for controlling transmission of electromagnetic waves according to the present disclosure includes: a conductor line which is positioned on a signal layer and through which electromagnetic waves received via an input terminal travel; a ground layer electrically separated from the signal layer through a dielectric layer and electrically grounded; a shunt via including a first end and a second end and connected to the conductor line through the first end; and a photoconductive semiconductor connected between the second end of the shunt via and the ground layer and having a dielectric state or a conducting state, based on an input of an (Continued)

optical signal, wherein the conductor line is electrically connected to the ground layer via the shunt via and the photoconductive semiconductor in the conducting state, thereby causing reflection of electromagnetic waves from the shunt via.

15 Claims, 21 Drawing Sheets

(51) Int. Cl.
  H05K 1/02 (2006.01)
  H05K 1/11 (2006.01)
  H03K 5/00 (2006.01)

(56) References Cited

U.S. PATENT DOCUMENTS

| | | | |
|---|---|---|---|
| 4,358,759 A | 11/1982 | Stewart et al. | |
| 4,584,543 A | 4/1986 | Taylor, Jr. et al. | |
| 4,616,196 A | 10/1986 | Sharma | |
| 4,845,449 A | 7/1989 | Stern et al. | |
| 5,142,255 A | 8/1992 | Chang et al. | |
| 5,155,493 A | 10/1992 | Thursby et al. | |
| 5,166,640 A | 11/1992 | Fathimulla et al. | |
| 5,278,529 A | 1/1994 | Wllems | |
| 5,304,960 A | 4/1994 | Das | |
| 5,339,053 A | 8/1994 | Lux et al. | |
| 6,121,852 A | 9/2000 | Mizoguchi et al. | |
| 6,414,564 B1 | 7/2002 | Mizoguchi et al. | |
| 6,573,808 B1 | 6/2003 | Burin | |
| 6,580,337 B1 | 6/2003 | Valas | |
| 6,583,765 B1 | 6/2003 | Schamberger et al. | |
| 6,630,909 B2 | 10/2003 | Nepveu | |
| 6,756,857 B2 | 6/2004 | Aikawa et al. | |
| 6,757,523 B2 | 6/2004 | Fry | |
| 6,995,572 B2 | 2/2006 | Arndt et al. | |
| 6,996,305 B2 | 2/2006 | Kim et al. | |
| 7,035,602 B2 | 4/2006 | Satoh et al. | |
| 7,053,630 B2 | 5/2006 | Westerling et al. | |
| 7,088,290 B2 | 8/2006 | Ohno et al. | |
| 7,145,405 B2 | 12/2006 | Aikawa et al. | |
| 7,356,349 B2 | 4/2008 | Furutani et al. | |
| 7,498,970 B2 | 3/2009 | Yoshida | |
| 7,518,556 B2 | 4/2009 | Kurashima et al. | |
| 7,689,070 B2 | 3/2010 | Ouchi | |
| 7,764,146 B2 | 7/2010 | Yu et al. | |
| 7,773,035 B2 | 8/2010 | Murata et al. | |
| 7,843,992 B2 | 11/2010 | Mohamadi | |
| 7,855,696 B2 | 12/2010 | Gummalla et al. | |
| 7,952,534 B2 | 5/2011 | Iwata et al. | |
| 8,258,892 B2 | 9/2012 | Abhari et al. | |
| 8,284,102 B2 | 10/2012 | Hayes et al. | |
| 8,362,965 B2 | 1/2013 | Henderson | |
| 8,570,223 B2 | 10/2013 | Arslan et al. | |
| 8,599,083 B2 | 12/2013 | Lindenmeier et al. | |
| 8,624,373 B2 | 1/2014 | Camiade et al. | |
| 8,829,973 B2 | 9/2014 | Sander | |
| 8,995,912 B2 | 3/2015 | Rofougaran | |
| 9,035,838 B2 | 5/2015 | Le Bars et al. | |
| 9,444,401 B1 | 9/2016 | Schafferer | |
| 9,496,610 B2 | 11/2016 | Blech | |
| 9,590,300 B2 | 3/2017 | Artemenko et al. | |
| 9,853,680 B2 | 12/2017 | Lee | |
| 10,802,375 B2 * | 10/2020 | Makurin | H05K 1/0243 |
| 2005/0046523 A1 | 3/2005 | Wu et al. | |
| 2005/0201672 A1 | 9/2005 | Mansour et al. | |
| 2005/0287824 A1 | 12/2005 | Shapoval et al. | |
| 2007/0004363 A1 | 1/2007 | Kusaka et al. | |
| 2010/0283132 A1 | 11/2010 | Shapoval et al. | |
| 2017/0062948 A1 | 3/2017 | Artemenko et al. | |

FOREIGN PATENT DOCUMENTS

| | | |
|---|---|---|
| EP | 1 158 659 A1 | 11/2001 |
| EP | 0 935 826 B1 | 6/2003 |
| EP | 1 790 996 A1 | 5/2007 |
| EP | 1 804 335 A1 | 7/2007 |
| EP | 2 009 742 A1 | 12/2008 |
| EP | 2 133 953 A1 | 12/2009 |
| EP | 1 903 328 B1 | 12/2011 |
| EP | 2 625 784 B1 | 9/2015 |
| EP | 1 825 558 B1 | 6/2016 |
| EP | 1 952 483 B1 | 12/2016 |
| GB | 1 336 587 A | 11/1973 |
| GB | 1 470 884 A | 4/1977 |
| GB | 1 511 204 A | 5/1978 |
| JP | 2-276308 A | 11/1990 |
| JP | 3318475 B2 | 8/2002 |
| JP | 2006-54643 A | 2/2006 |
| JP | 2007-104627 A | 4/2007 |
| JP | 4615486 B2 | 1/2011 |
| KR | 10-0760231 B1 | 9/2007 |
| KR | 10-2010-0131155 A | 12/2010 |
| KR | 10-2012-0054922 A | 5/2012 |
| KR | 10-1174440 B1 | 8/2012 |
| RU | 2 644 028 C1 | 2/2018 |
| WO | 2009/023551 A1 | 2/2009 |

OTHER PUBLICATIONS

Communication dated Mar. 19, 2021, from the European Patent Office in European Application No. 19806569.0.
International Search Report (PCT/ISA/210) and Written Opinion (PCT/ISA/237) dated Aug. 28, 2019 by the International Searching Authority in International Patent Application No. PCT/KR2019/006063.
Communication dated Jan. 18, 2019 by the Russian Intellectual Property Office in counterpart Russian Patent Application No. 2018118601.
Tawk, Y. et al., "Optically Pumped Frequency Reconfigurable Antenna Design", IEEE Antennas and Wireless Propagation Letters, vol. 9, Apr. 5, 2010, pp. 280-283. (4 pages total).
Kowalczuk, Emma Kristina, "Simulating, Fabricating and Characterising Photoconductive Microwave Switches for RF Applications", Doctoral Thesis, Loughborough University, Apr. 2014. (249 pages total).
Communication dated Nov. 16, 2021 by the State Intellectual Property Office of the People's Republic of China in Chinese Patent Application No. 201980034263.5.

* cited by examiner

Above microstrip

Under microstrip

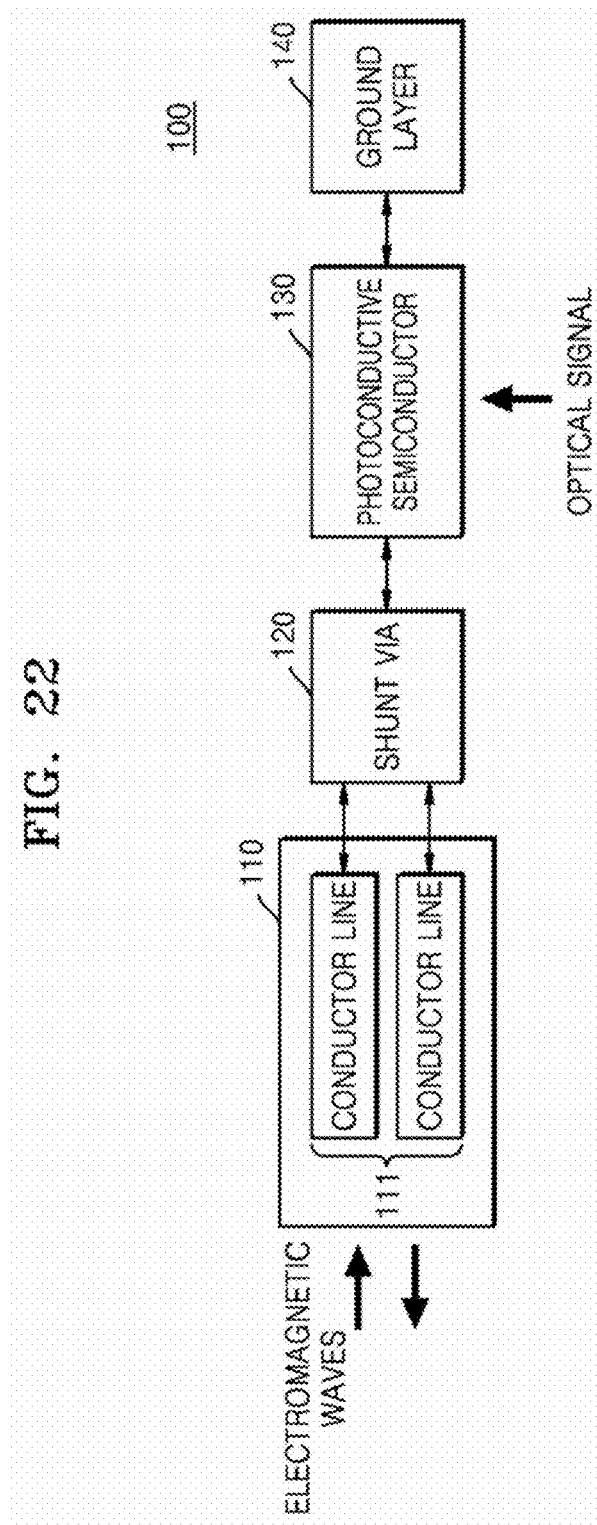

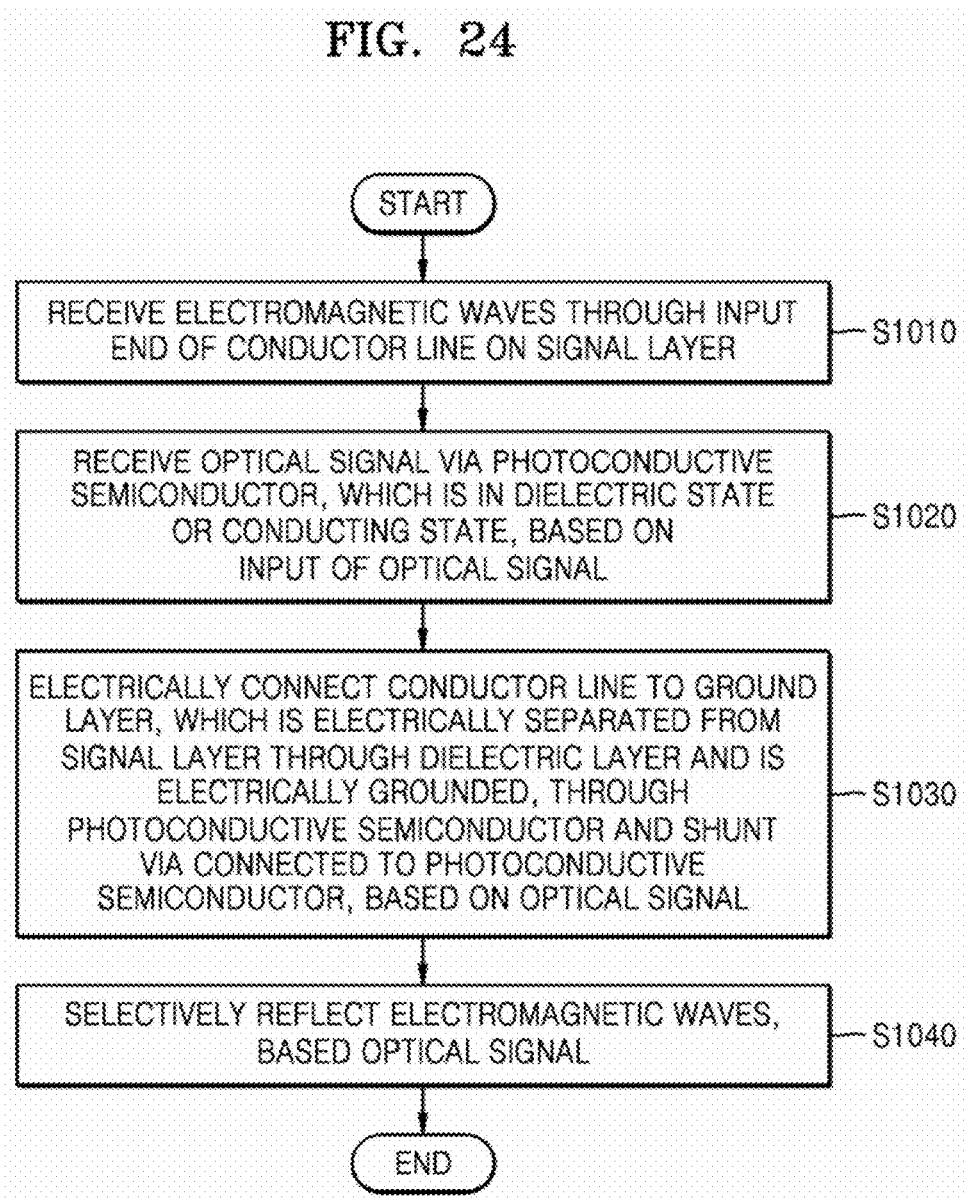

METHOD FOR CONTROLLING TRANSMISSION OF ELECTROMAGNETIC WAVE ON BASIS OF LIGHT, AND DEVICE THEREFOR

TECHNICAL FIELD

The present disclosure relates to a method of controlling transmission of electromagnetic waves, based on light, e.g., an optical signal, and more particularly, to a switch capable of being turned on or off, based on an optical signal, and an operation method thereof.

BACKGROUND ART

The continuous demand of users for easy communication characteristics in a high frequency band has led to the rapid development of communication technology. In recent years, 5G communication using millimeter wave bands are being developed. 5G communication may be characterized by high-performance metrics based on user experience, including factors such as energy efficiency and a high-speed transmission rate.

A scenario of wireless communication systems may be changed by sensors used in vehicle navigation and standard 5G communication. For new application technologies using millimeter wave bands, novel technology for integrating data transmission capabilities and detection capabilities into a single wireless device may be required. Among available technologies, devices implemented on a printed circuit board (PCB) play an important role and may be characterized by a simple design and process, cost-effective embedding in a single dielectric substrate, and a basis suitable for broadband implementation, ease of integration with conventional printed circuit board technology, and the like.

DESCRIPTION OF EMBODIMENTS

Technical Problem

There is a need for a method of controlling electromagnetic waves to be integrated in a high frequency band in a simple and easy manner.

Technical Solution to Problem

A device for controlling transmission of electromagnetic waves according to an embodiment of the present disclosure includes a conductor line which is positioned on a signal layer and along which an electromagnetic wave received via an input terminal travels, a ground layer electrically separated from the signal layer through a dielectric layer and electrically grounded, a shunt via including a first end and a second end and connected to the conductor line through the first end, and a photoconductive semiconductor connected between the second end of the shunt via and the ground layer and having a dielectric state or a conducting state, based on an input of an optical signal, wherein the conductor line is electrically connected to the ground layer via the shunt via and the photoconductive semiconductor, which is in the conducting state, thereby causing reflection of an electromagnetic wave from the shunt via.

Advantageous Effects of Disclosure

Embodiment set forth herein provide a method and device for controlling electromagnetic waves to be easily integrated in a high frequency band at low cost.

BRIEF DESCRIPTION OF DRAWINGS

The present disclosure will be easily understood from the following detailed description in conjunction with the accompanying drawings, and reference numerals denote structural elements.

FIG. 22 is a block diagram of a device for controlling transmission of electromagnetic waves, e.g., an opto-switch, according to an embodiment.

FIG. 24 is a flowchart of a method of controlling transmission of electromagnetic waves, according to an embodiment.

BEST MODE

A device for controlling transmission of electromagnetic waves according to an embodiment of the present disclosure includes a conductor line which is positioned on a signal layer and along which an electromagnetic wave received via an input terminal travels, a ground layer electrically separated from the signal layer through a dielectric layer and electrically grounded, a shunt via including a first end and a second end and connected to the conductor line through the first end, and a photoconductive semiconductor connected between the second end of the shunt via and the ground layer and having a dielectric state or a conducting state, based on an input of an optical signal, wherein the conductor line is electrically connected to the ground layer via the shunt via and the photoconductive semiconductor, which is in the conducting state, thereby causing reflection of an electromagnetic wave from the shunt via.

MODE OF DISCLOSURE

Hereinafter, embodiments according to the present disclosure will be described in detail with reference to the accompanying drawings. In addition, a method of configuring and using an electronic device according to an embodiment of the present disclosure will be described in detail with reference to the accompanying drawings. The same reference numbers or signs in each drawing represent parts or components that perform substantially the same function.

Terms, including ordinal numbers such as first and second, may be used to describe various components but these components are not limited by these terms. These terms are only used to distinguish one component from another. For example, a first component may be referred to as a second component without departing from the scope of the present disclosure, and similarly, a second component may also be referred to as a first component. The term "and/or" includes a combination of a plurality of related items described herein or any one of the plurality of related items.

The terms described herein are only used to describe embodiments and are not intended to limit the present disclosure. As used herein, the singular expressions are intended to include plural forms as well, unless the context clearly dictates otherwise. It should be understood that the terms 'comprise' and/or 'comprising', when used herein, specify the presence of stated features, integers, steps, operations, elements, components, or a combination thereof, but do not preclude the presence or addition of one or more features, integers, steps, operations, elements, components, or a combination thereof.

Figure 1:
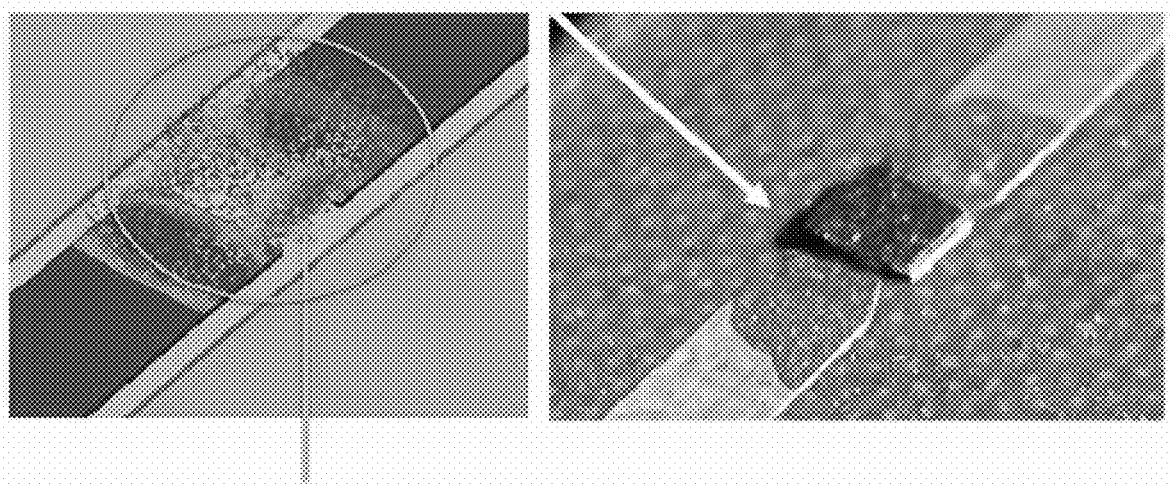
FIG. 1 is a view for explaining a microstrip switch according to an embodiment.

FIG. 1 is a diagram illustrating a microstrip radio-frequency (RF) switch and a distribution of current therein.

A PIN diode, a Metal-Oxide-Semiconductor Field-Effect transistor (MOSFET) or a Micro-Electro-Mechanical Systems (MEMS) may be generally used as a switching component of a high-frequency circuit. In this case, a complex bias circuit (switching from a positive current source to a negative voltage source) may be required for the PIN diode, the MOSFET may have a high parasitic capacitance in a low channel resistance state, and the MEMS may have a limited number of times of a switching cycle and high control voltage.

Therefore, in general, switching technology for devices (a switch, a phase shifter, an antenna, etc.) for transmitting and receiving high-frequency signals is very highly complicated and thus costs for conventional millimeter-wave-band products (>10 GHz), e.g., switches, may be required. In the case of switching technology for high-frequency signals, RF loss may increase due to crossing of a bias for a radio frequency channel and a power supply circuit or a complex bias and a complex supply circuit may be required. Therefore, a space for a large printed circuit board including bulky components may be required and thus it may be difficult to integrate the printed circuit board into small devices.

For example, a microstrip diode high-isolation switch has been suggested in an example based on U.S. Pat. No. 3,678,414. In the above-suggested example, a PIN-diode-based microstrip switch, which may be embodied as a resistor, is included in a broadband resonant circuit that can be switched between two states. When the PIN diode is in a conducting state, the resistor may appear in the form of a closed circuit. However, when this method is used, RF coupling may occur in a waveguide between a bias and a supply circuit of the PIN diode, and a process is cumbersome and complicated.

A microstrip single-pole double-throw switch with a plurality of MEMS contacts has been suggested in another example based on U.S. Pat. No. 6,580,337 B1. In the above-suggested example, a pair of first contacts are positioned in close proximity to a junction of input and output lines to optimize bandwidth performance. In addition, MEMS contacts that are not close to the junction are spaced along the output line to optimize insulation and throughput in the "off" state, and minimize insertion loss in the "on" state. The above-described solution is disadvantageous in that the bias and the supply circuit are complicated and an expensive and complex process is required for a high-frequency operation.

In another embodiment, a microstrip RF switch connected in series to a microstrip line (i.e., in a microstrip gap), based on a photoconductive switch element, has been suggested based on Y. Tawk et. al., "Optically Pumped Frequency Reconfigurable Antenna Design", IEEE ANTENNAS AND WIRELESS PROPAGATION LETTERS, VOL. 9, 2010 and E. K. Kowalczuk, "Simulating, Fabricating and Characterising Photoconductive Microwave Switches for RF Applications", PhD Thesis. Referring to FIG. 1, in a microstrip RF switch, current may be concentrated near edges of a semiconductor having low electrical conductivity due to an edge effect and surface recombination of carriers at the edges. In contrast, a minimum current density is observed at the center of the microstrip with less surface recombination. As a result, high loss may occur when current passes through low conductivity portions of the switch and thus high optical power may be required to set the switch to the "on" state. In addition, such types of switches may have a low level of blocking due to a parasitic capacitance.

Therefore, in the case of a high-frequency signal transceiving device having a very high driving frequency (e.g., 100 GHz or more), technology for achieving a low loss rate, low control power, a compact size, a simple bias and a supply circuit for avoidance of a parasitic effect, a possibility of easy integration based on PCB technology, and low cost may be required. As described above, according to the above examples, it is difficult to satisfy all these conditions.

A device for controlling transmission of electromagnetic waves according to an embodiment of the present disclosure, e.g., an opto-switch, may include a printed circuit board including a signal layer, a ground layer, and a dielectric layer between the single layer and the ground layer. In one embodiment, the signal layer may include a microstrip conductor and a matching element. The opto-switch may be located on the dielectric layer between the signal layer and the ground layer of the printed circuit board, and include a shunt metalized via, i.e., a shunt via, separated from the ground layer of the printed circuit board due to a dielectric gap. In one embodiment, the shunt via may be electrically connected to the microstrip conductor and the matching element. The opto-switch may further include a photoconductive semiconductor element (PSE) located on a ground layer of the printed circuit board and electrically connected to the shunt via and the signal layer of the printed circuit board. The photoconductive semiconductor element may have at least two states, e.g., a dielectric state ("off" state) of low intrinsic electrical conductivity due to the absence of a control luminous flux, and a conducting state ("on" state) of relatively high electrical conductivity due to the presence of a control luminous flux. The control luminous flux described above may be configured to compensate for parasitic capacitance occurring in a gap between a contact pad of the shunt via and the ground, and may have inductive properties in an operating bandwidth of the switch.

In one embodiment, the shunt via may be in direct contact with the microstrip conductor and the matching element.

In one embodiment, the opto-switch may further include an auxiliary matching element electrically connected to the shunt via, configured to compensate for reactance of the shunt via, and having a capacitive characteristic in an operating frequency bandwidth of the switch.

In one embodiment, the auxiliary matching element may be in the form of a conductive pad positioned to be separated by an additional dielectric layer outside the signal layer of the printed circuit board, and the shunt via may not be in contact with the signal layer.

In one embodiment, the shunt via may be in the form of a break, and the auxiliary matching element may be embodied as a capacitor embedded in the shunt via and provided in the form of a plane in the break to be parallel to the signal layer and the ground layer. In one embodiment, one plane may be in contact with the shunt via at one end of the break and another plane may be in contact with the shunt via at another end of the break.

In one embodiment, the printed circuit board may have a multilayer structure.

In one embodiment, the opto-switch may further include a light source connected to photoconductive elements, including the photoconductive semiconductor element, to supplying light to the photoconductive elements.

In one embodiment, the light source may be a light-emitting diode (LED) or a laser diode.

In one embodiment, the opto-switch may further include a control circuit connected to the light source to control a state of the light source.

In one embodiment, the opto-switch may control the light source in a pulse mode. In the pulse mode, the control circuit may generate a first pulse with a duration sufficient to set the switch to the "on" state, and generate a subsequent pulse with a duration shorter than a carrier lifetime of a material of a photoconductive element and sufficient to completely restore to the "on" state while maintaining the switch in the "on" state.

In one embodiment, the opto-switch may further include a dielectric transparent spacer located between the photoconductive element and the light source to be connected to the photoconductive element and the light source, and a feed conductor which is located in the dielectric transparent spacer, one end of which is connected to a second contact output of the light source, and another end of which is connected to a second feeding output of the control circuit. In this case, a first contact output of the light source may be connected to a first feeding output of the control circuit.

In one embodiment, the photoconductive element may cover both the shunt via and the dielectric gap.

In one embodiment, the photoconductive element may be passivated.

In one embodiment, the matching element may be provided in the form of a microstrip branch from a point of connection to the microstrip conductor.

In one embodiment, the matching element may be provided in a triangular shape with a vertex at the point of connection to the microstrip conductor.

In one embodiment, the opto-switch may further include a short via in the dielectric layer between the signal layer and the ground layer of the printed circuit board. The short via may be connected to a distal end of the matching element and the ground layer of the printed circuit board.

In one embodiment, the switch may be used as a switch element in a microstrip phase shifter, an antenna, or a single-pole multi-throw switch.

In one embodiment, the microstrip phase shifter may include a directional coupler which includes an input port, an output port, and two branches, and two controllable reflective load elements each including one end connected to a corresponding branch of the directional coupler and another end connected to a metalized via electrically connected to the ground. In this case, the opto-switch according to the embodiment may be used as at least a part of the controllable reflective load element. In one embodiment, a wave may be reflected from the shunt via when the switch is "on" and reflected from an end via when the switch is "off". In one embodiment, in the opto-switch, a phase shaft may be determined by a length of the microstrip conductor and a point of connection to the photoconductive element.

In one embodiment, the microstrip phase shifter may include a quarter-wavelength section of a transmission line, one end of which is connected to an input of the phase shifter and a first branch and another end of which is connected to an output of the phase shifter and a second branch. In this case, lines of the first and second branches are connected in series to the transmission line. The microstrip phase shifter may further include an opto-switch according to an embodiment and an additional segment of the transmission line. In this case, an output of the opto-switch may be connected to a distal metalized via, which is electrically connected to ground, through the additional segment. A wave may be reflected from the shunt via while the switch is "on" and reflected from the end via while the switch is "off". In one embodiment, a required phase shift may be determined by a length of all elements of a line of a branch and the point of connection to the photoconductive element.

In one embodiment, the microstrip antenna may include at least one radiating element with two arms connected to an input of the antenna. In one embodiment, the opto-switch according to the embodiment may be located on each arm of the radiating element, spaced a ¼ wavelength from an input of the antenna, and may have a different on/off state at each point of time when polarity of the radiating element is controlled.

In one embodiment, the radiating element may be a dipole, and in this case, the antenna may provide radiation in an end-fire direction.

In one embodiment, the radiating element may be a microstrip patch antenna, i.e., a microstrip cavity antenna. In this case, the antenna may provide radiation in a broadband direction.

In one embodiment, the microstrip antenna may include two radiating elements, one of which may be a dipole and the other may be a patch, and provide radiation in both the end-fire direction and the broadband direction.

In one embodiment, the microstrip antenna may be provided using a multilayer printed circuit board, and in this case, the two radiating elements may be stacked on different conductive layers of the printed circuit board.

In one embodiment, the single-pole multi-throw (SPnT) switch may include a plurality of opto-switches spaced a ¼ wavelength from an intersection of an input port, a plurality of output ports, and microstrips connecting the input port to the plurality of output ports, and a switch located in a path between the input port and a desired output port may be "on" and the other switches may be "off" to connect the input port to the desired output port.

In one embodiment, a microstrip SPnT switch may include a multiway power divider with a plurality of power dividers each having one input and two outputs, and a plurality of opto-switches. In this case, the plurality of opto-switches may be located within arms of the power dividers to be spaced a ¼ wavelength from the intersection. In the SPnT switch described, in order to connect the input port to a desired output port of the multiway power divider, a switch located in a path between the input port and the desired output port of the multiway power divider may be "off" and the other switches may be "on".

The present disclosure may provide a simple and inexpensive opto-switch exhibiting improved performance over the solutions according to the related art and configured to operate in a millimeter wave range.

Figure 2A:
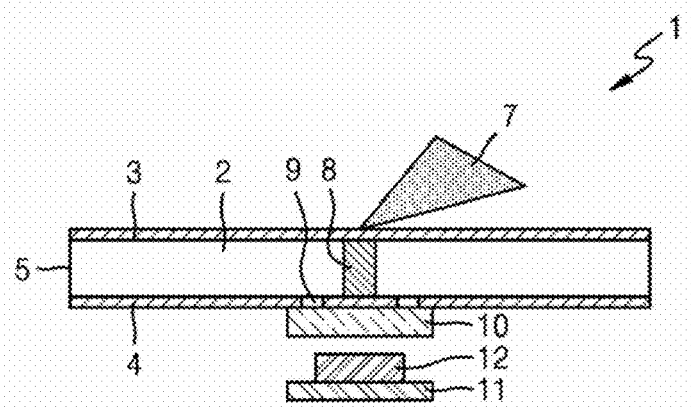
FIG. 2A is a side view of an opto-switch according to an embodiment.
Figure 2B:
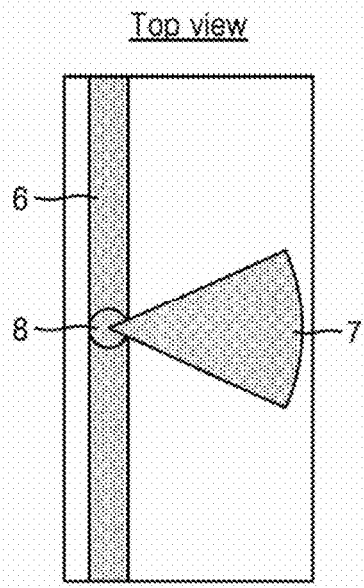
FIG. 2B is a plan view of an opto-switch according to an embodiment.
Figure 2C:
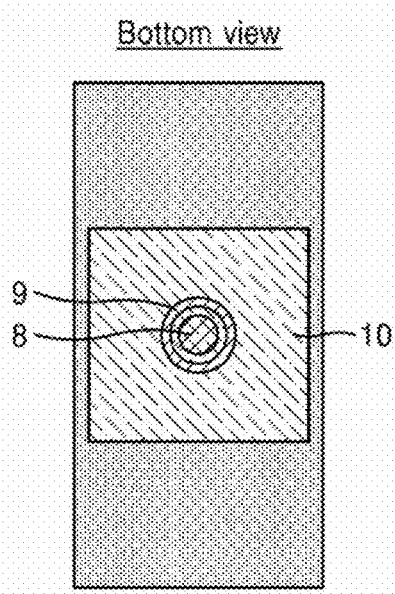
FIG. 2C is a bottom view of an opto-switch according to an embodiment.

FIGS. 2A to 2C are diagrams illustrating a device for controlling transmission of an electromagnetic wave, based on an optical signal (hereinafter referred to as an opto-switch), according to an embodiment. Specifically, FIG. 2A is a side view of the opto-switch according to an embodiment, FIG. 2B is a plan view (top view) of the opto-switch, and FIG. 2C is a bottom view of the opto-switch.

Referring to FIGS. 2A to 2C, a switch 1 may include a printed circuit board 2, and the printed circuit board 2 may include a signal conductive layer 3, a ground conductive layer 4, and a dielectric layer 5 between the signal conductive layer 3 and the ground conductive layer 4. In one embodiment, the signal conducting layer 3 may include a microstrip conductor 6 and a matching element 7 which are connected to each other. The microstrip conductor 6 may serve as a path through which electromagnetic waves travel.

FIG. 2A illustrates that the matching element 7 is located beyond a board for better understanding, but it would be apparent to those of ordinary skill in the art that actually, the matching element 7 may be positioned on the signal conductive layer 3 of the printed circuit board 2.

Ends of the microstrip conductor 6 may be the input and output ports of the switch. At an interface between the microstrip conductor 6 and the matching element 7, a shunt via 8, e.g., a shunt metalized via, may be provided on the printed circuit board 2. The shunt via 8 is in direct electrical contact with the microstrip conductor 6 and the matching element 7 but is separated from the ground conductive layer 4 of the printed circuit board 2 by the dielectric gap 9 and thus may not be in direct contact with the ground conductive layer 4.

In one embodiment, one of main functions of the switch may be performed by a PSE 10 on the ground conductive layer 4 of the printed circuit board 2. The PSE 10 may be connected to the shunt via 8 and the ground conductive layer 4. The PSE 10 may have at least two states. A first state of the PSE 10 may be an "off" state which is a dielectric state of low intrinsic electrical conductivity due to the absence of control luminous flux. A second state of the PSE 10 may be an "on" state which is a conducting state of relatively high electrical conductivity due to the presence of the control luminous flux.

In addition, referring to FIG. 2A, a control circuit 11 and a light source 12, e.g., a light-emitting diode (LED), may be included in the printed circuit board 2. Light may be applied to the PSE 10 from an LED that is turned on or off by the control circuit 11 using power handling.

Figure 3:
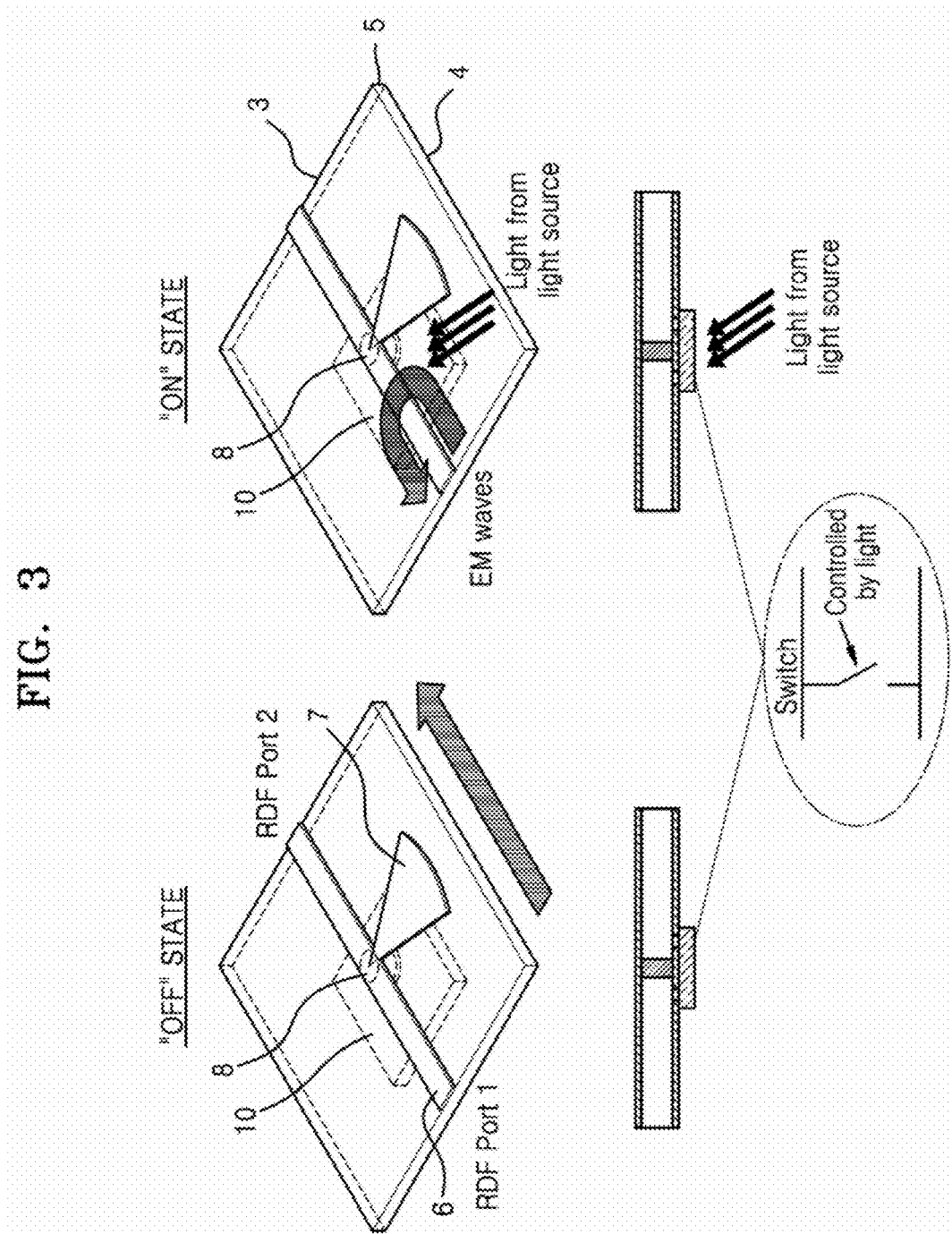
FIG. 3 is a view for explaining an operating principle of an opto-switch according to an embodiment.

FIG. 3 is a view for explaining an operating principle of an opto-switch according to an embodiment.

Referring to FIG. 3, when no light is supplied to the PSE 10, the PSE 10 is in an "off" state which is a dielectric state. An electromagnetic wave entering a switch 1 through an input port RF port 1 may enter an output port RF port 2 with virtually no loss without being reflected to a great degree from the PSE 10 and the shunt via 8.

When light is applied to the PSE 10, the PSE 10 is in an "on" state, which is a conducting state, and thus, the signal conductive layer 3 may be shorted to the ground conductive layer 4. Therefore, electromagnetic wave entering the switch 1 through the input port RF port 1 may be reflected from the PSE 10 and the shunt via 8 and thus not reach the output port RF port 2.

Parasitic capacitance, which lowers performance of the switch and causes losses in the "off" state, may occur a dielectric gap between the shunt via 8 described above (particularly, between a portion of a contact pad connecting the shunt via 8 and the PSE 10) and the ground (particularly, a portion of a contact pad connecting the ground conductive layer 4 and the PSE 10). In one embodiment, the matching element 7 may be configured to compensate for the parasitic capacitance. Accordingly, the matching element 7 may have to have an inductive property in the driving frequency band of the switch 1. The matching element 7 may form a parallel resonance circuit having a partial connection with parasitic capacitance, inductance of the shunt via 8, and conductivity of the PSE 10, and in this case, may have high resistance in a resonance region. An equivalent circuit and a transmission rate of a switch in the "off" state or the "on" state according to an embodiment will be described with reference to FIGS. 4A and 4B below.

Figure 4A:
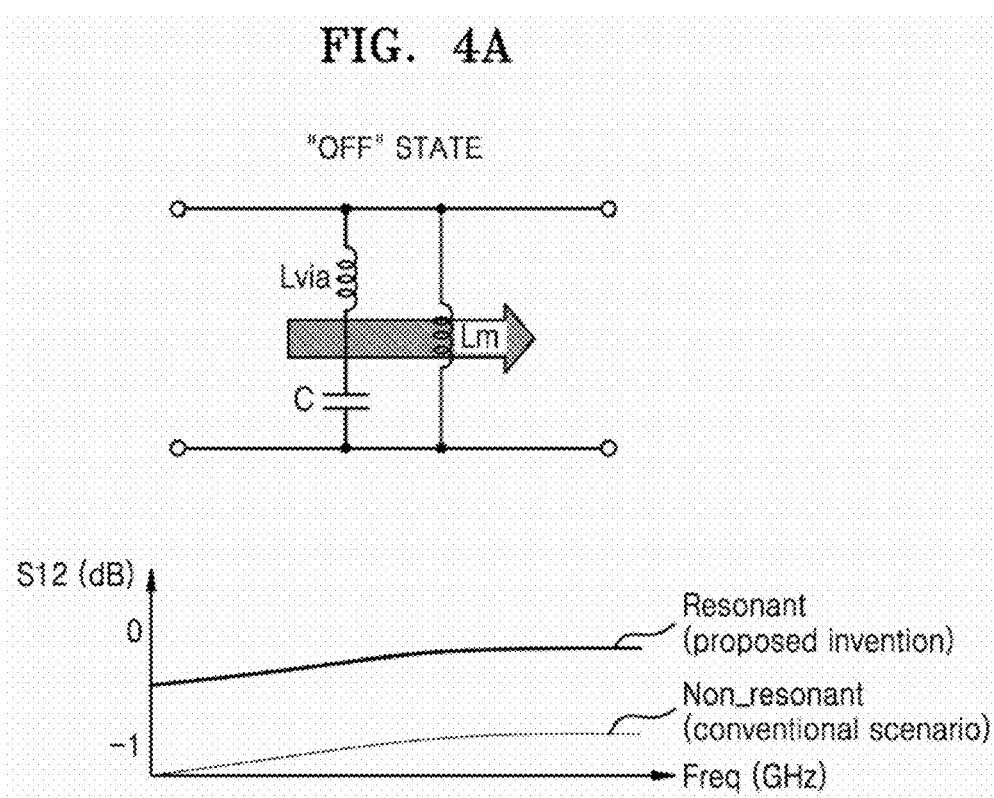
FIG. 4A is a diagram illustrating an equivalent circuit of a switch that is in an "off" state and a transmission ratio thereof according to an embodiment.
Figure 4B:
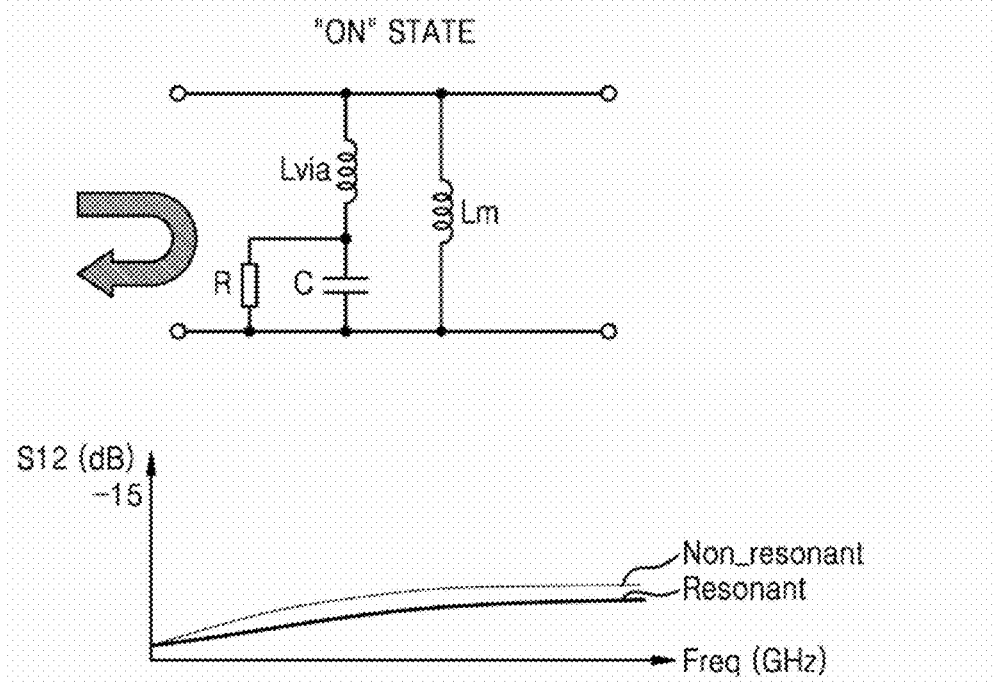
FIG. 4B is a diagram illustrating an equivalent circuit of a switch that is in an "on" state and a transmission ratio thereof according to an embodiment.

FIG. 4A is a diagram illustrating an equivalent circuit of a switch that is in the "off" state and a transmission ratio thereof, according to an embodiment. FIG. 4B is a diagram illustrating an equivalent circuit of a switch that is in the "on" state and a transmission ratio thereof, according to an embodiment.

Referring to FIGS. 4A and 4B, an inductance of a matching element may be expressed by Equation 1 below.

$$\omega_{res}^2 = 1/[(L_m + L_{via})C], \quad \text{[Equation 1]}$$

In Equation 1, $\omega_{res}$ denotes a resonance frequency, $L_m$ denotes the matching element inductance, $L_{via}$ denotes an inductance of a shunt via, and C denotes a parasitic capacitance.

Referring to FIG. 4A, in an "off" state in which light is not applied to a PSE, a shunt via may be equivalent to an inductive element L, and a region of contact among the PSE which is a semiconductor, a dielectric gap, and the shunt via may be equivalent to a capacitive element C. Referring to a graph of FIG. 4A, in an example of a non-resonance (when there is no matching element), in the "off" state, loss occurs due to reflection of waveforms at discontinuous points of a line due to parasitic capacitance, and thus, a transmission rate may decrease. In contrast, in an example of resonance (when there is a matching element), an oscillating circuit having a high resistance value occurs in a resonance region and electromagnetic waves may pass through a structure with little loss, and thus a transmission rate may be remarkably improved.

Referring to FIG. 4B, in an "on" state in which light is applied to a PSE, a shunt via may be equivalent to an inductive element L and the PSE, which is a semiconductor, may be equivalent to a resistance element. In this case, an inductance may partially shunt a line connected in parallel to a low resistance of the PSE. That is, referring to a graph of FIG. 4B, in an "on" state, locking characteristics of the switch may hardly change when a matching element is added (i.e., in an example of resonance).

Accordingly, the PSE and the shunt via may function as an opto-switch operating based on a photoconductive effect, together with a region of a printed circuit board on which a microstrip conductor and a matching element are located. A supply/bias circuit of the switch may be isolated from an RF path. The characteristics of the switch may be controlled by changing power of supplied light. Such a switch may have a low loss rate even at high frequencies and may not be significantly affected by external components. In addition, such a switch is easily installable in any desired position on a printed circuit board, including a multi-layer board. By minimizing the number of components, costs and complexity may be reduced and a possibility of integration into a compact device may be provided. In addition, an opto-switch according to the present disclosure has a relatively wide driving frequency, e.g., 10 to 20% in one embodiment.

Figure 5A:
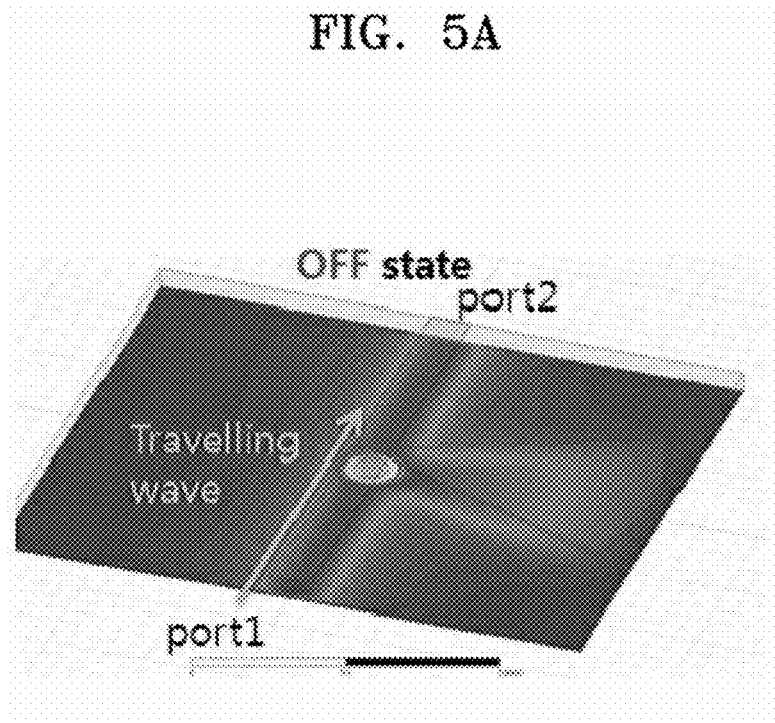
FIG. 5A is a diagram illustrating a simulation result of a switch in the "off" state according to an embodiment.
Figure 5B:
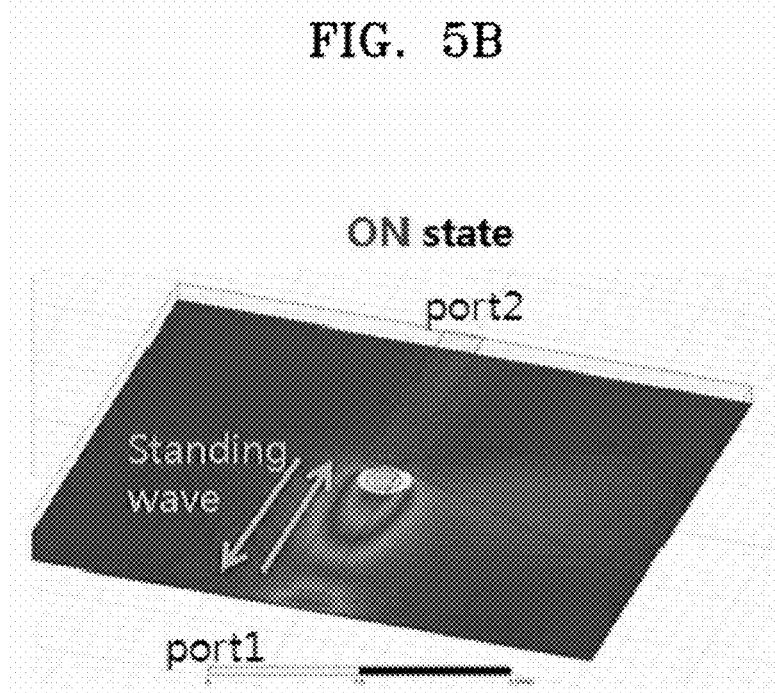
FIG. 5B is a diagram illustrating a simulation result of a switch in the "on" state according to an embodiment.

A simulation of an operation of a switch according to the embodiment of the present disclosure will be described with reference to FIGS. 5A and 5B below. Specifically, FIG. 5A is a diagram illustrating a simulation result of a switch that is in the "off" state according to an embodiment. FIG. 5B is a diagram illustrating a simulation result of a switch that is in the "on" state according to an embodiment.

Referring to FIG. 5A, in the "off" state, an amplitude of a wave traveling from an input port port1 to an output port port2 decreases to only a small level. That is, a transmission rate with respect to the output port port2 may be higher than −1 dB, and reflectivity with respect to the input port port1 may be lower than −20 dB.

Referring to FIG. 5B, in an "on" state, a wave traveling from an input port port1 to an output port port2 is almost completely reflected by an opto-switch. That is, a transmission rate with respect to the output port port2 may be lower than −20 dB. A transmitted and reflected wave may form a standing wave between the input port port1 and the switch, and a maximum current point may appear near the switch. In this case, the reflectivity with respect to the input port port1 may be higher than −1 dB.

Figure 6:
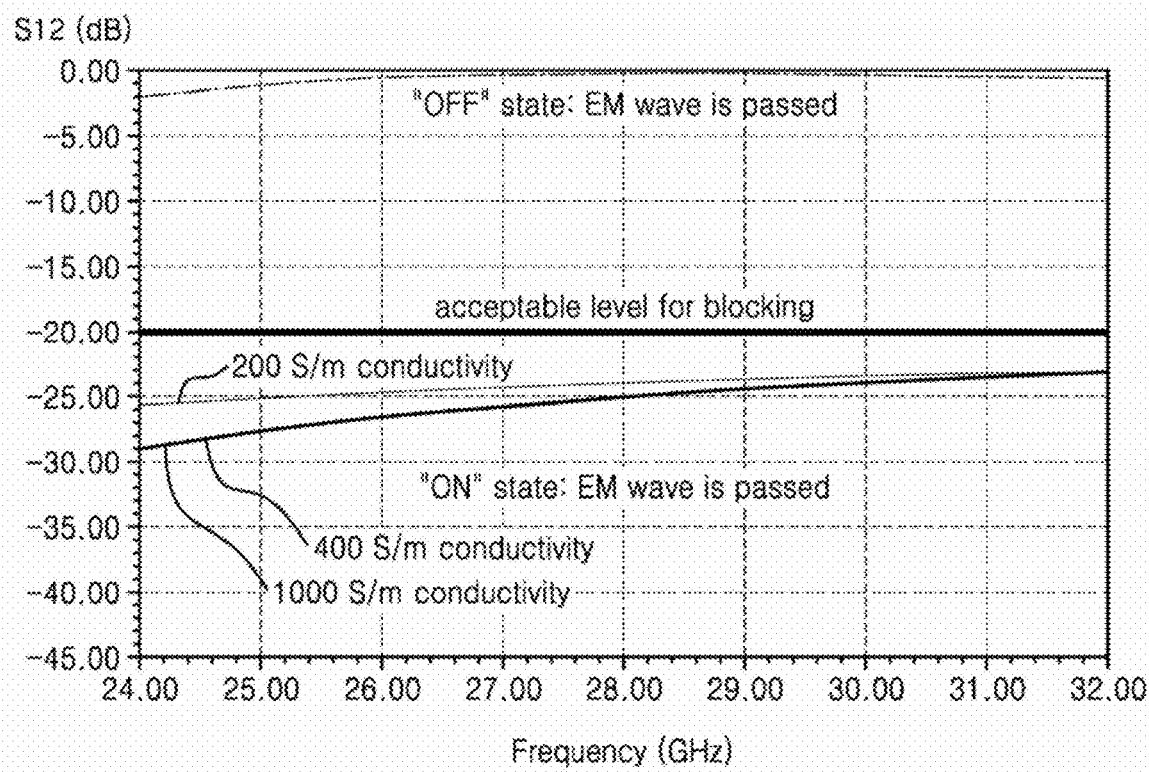
FIG. 6 is a diagram illustrating dependence of a transmission rate on a frequency of a simulated switch according to an embodiment.

FIG. 6 is a diagram illustrating dependence of a transmission rate on a frequency of a simulated switch according to an embodiment. More specifically, FIG. 6 is a diagram illustrating dependence of a transmission rate on a frequency from an input port port1 to an output port port2.

Referring to FIG. 6, according to an embodiment of the present disclosure, a positive characteristic may appear even under a low light condition. For example, when conductivity of a PSE is already 200 S/m, a sufficient transmission rate of less than −20 dB may be ensured. Therefore, because a level of conductivity required for the PSE may significantly reduce, it may be sufficient to lock a switch to a specified level even when an intensity of supplied light is low. Accordingly, the switch according to the present disclosure is capable of providing high sensitivity and low power consumption even under low light conditions.

Figure 7:
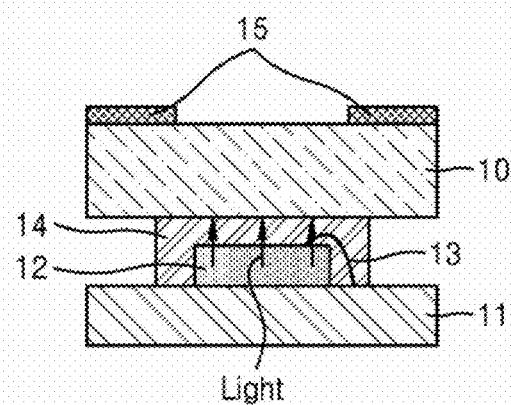
FIG. 7 is a view of an optical supply of a photoconductive semiconductor element according to an embodiment.

FIG. 7 is a view of an optical supply of a PSE according to an embodiment. In one embodiment, an LED may be used as a light source because optical power of the LED is sufficient to provide desired operating modes of an opto-switch according to an embodiment of the present disclosure. Commercially readily available LEDs may each include two contacts at both sides thereof. Thus, in order to supply power, a contact may be directly provided at an end of a first supply of a control circuit 11, and a feed conductor 13 may be additionally required. In order to prevent the feed conductor 13 from being electrically connected to a PSE 10 (i.e., for power isolation), a dielectric transparent spacer 14 may be provided between an LED 12 and the PSE (10). The dielectric transparent spacer 14 may be used as a light guide to provide a required distance from the light source 12 to the PSE 10. A metal pad 15, e.g., a copper pad, may be a contact of the PSE 10 for forming a connection to a ground layer and a shunt via of a printed circuit board.

An opto-switch having a structure as described above may have very small volume, when taking into consideration a distribution of volume current in the PSE 10 in a target layout. Therefore, the opto-switch having the above-described structure may be easily integrated into a very small device, reduce complexity, and optimize power consumption. A light supply method as described above is merely an example, and it will be apparent to those of ordinary skill in the art that optical fiber or optical transmission according to another embodiment are applicable to an optical supply of a PSE.

Figure 8:
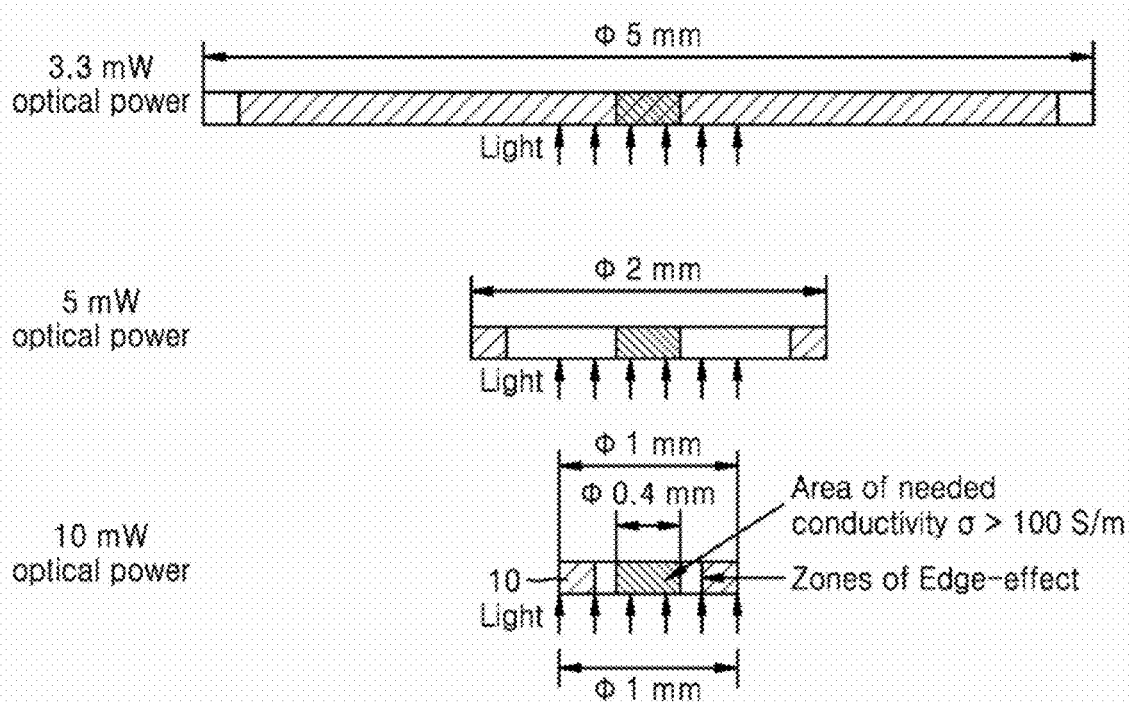
FIG. 8 is a diagram for explaining optical power required according to a size of an opto-switch element according to an embodiment.

FIG. 8 is a diagram for explaining optical power required according to a size of an opto-switch element according to an embodiment. A required intensity of an optical output may be influenced by a ratio between sizes of a light source and a PSE. In a simulation of a switch of the present embodiment, an optimal radius of a PSE was 1.4 mm (i.e., a diameter thereof was 2.8 mm), and a small amount of optical power of about 3.8 mW was required. A required amount of optical power gradually increases when the size of the PSE is reduced but does not reduce greatly even when the size of the PSE is increased. This effect is not limited to an example of the simulation but is applicable to other examples in the same or similar manner.

As illustrated in FIG. 8, different amounts of optical power may be required to ensure a conducting state of the PSE, under a condition that the sizes of LEDs are the same and the sizes of PSEs are different from each other. When a current space distribution in the PSE is considered, the size of a light spot and the size of a region to which a certain level of conductivity is provided are not changed. Therefore, the amount of optical power required for an optical supply may be reduced by twice or more by optimizing a ratio between longitudinal dimensions of the LED and PSE.

This effect may be achieved not only by the diffusion of electrons into the PSE through a conduction region under an action of light but also by reducing an influence of an area affected by an effect related to damage to a semiconductor structure due to mechanical cutting in the process. Therefore, electrons in this region have a short useful life, and a large amount of optical power may be required to make all semiconductor materials into the conducting state. At the same time, the quality of a surface of a wafer may be improved, and an influence of the surface of the wafer may be greatly reduced in a recombination process of minority carriers. Therefore, when the size of a device is comparable to that of a light source, a larger amount of optical power should be supplied to compensate for an influence of edges and ensure a certain level of conductivity in a desired area. However, as the size of the device is increased, the influence of edges to obtain a desired level of conductivity in a wider area under the same light source may be weakened due to the diffusion of conduction charges.

The same effect may be used to obtain the same area having a certain level of conductivity, increase the size of a semiconductor device, and reduce optical power consumption in a light source of a fixed size.

Therefore, according to an embodiment, current may be concentrated at a central portion of the PSE, which is a region having highest electrical conductivity. Accordingly, the demand for PSE design and the demand for optical power to be transmitted may be alleviated.

When the diffusion of electrons and the edge effect are considered, a method of calculating the concentration of photoconductive electrons n in a semiconductor device may be expressed by Equations 2 to 4 below.

$$\Delta_2 n - \frac{n}{s^2} = -\Phi \quad \text{[Equation 2]}$$

$$\frac{1}{r}\frac{d}{dr}\left(r\frac{dn}{dr}\right) - \frac{n}{s^2} = -\Phi \quad \text{[Equation 3]}$$

$$s^2 = D\tau \quad \text{[Equation 4]}$$

Equation 2 may be a Helmholtz equation, and Equation 3 may represent azimuthal symmetry. Here, s may represent a length of diffusion, D may represent a diffusion constant, τ may represent a lifetime of electrons of a semiconductor, and Φ may represent a lighting function. A boundary condition as shown in Equation 5 may be derived from the above Equations under an assumption that a density distribution of carriers is the same in a thickness direction (i.e., a z-axis direction).

$$\left.\frac{dn}{dr} + \frac{SRV}{D}n = 0\right|_{r=R} \quad \text{[Equation 5]}$$

An on/off-time of a key may be also controlled by controlling the dimension of the PSE and the lifetime of carriers in a region having a certain level of conductivity. An increase in the lifetime of carriers within the volume of the PSE may be understood to mean that transition of the carriers is increased according to a level of conductivity (or recombination) over the thickness of the entire PSE, that is, a longer time is needed until a device is finally switched on/off. In contrast, a PSE with carriers having a short lifetime may be quickly switched to the on/off state under a sufficient amount of optical power. Accordingly, by moving edges of a device away from or close to an area in which a certain level of conductivity should be ensured, the lifespan of bulk carriers may increase or decrease due to a recombination edge effect, and thus, a total on/off time of the switch may increase or decrease. Thus, optical power consumption and an on/off time of the switch may be optimized by selecting geometric parameters of the PSE and the light source according to a purpose of the device.

On the other hand, when this method is applied to a device that is limited in dimension, e.g., a portable device, even a change of several millimeters in internal components of the device may be significant, and when this method is applied to a device that is not limited in dimension, e.g., a base station, a change of several millimeters in the dimension of internal components of the device may be insignificant. Accordingly, in order to determine the dimensions of the PSE and the light source, all the dimension of the device, optical power consumption of the switch, the on/off time of the switch, and selection of a PSE based on a required level of conductivity may be considered.

Various materials of semiconductor, e.g., silicon or gallium-indium arsenide, may be selected as a material of the PSE. A switching time of an opto-switch may be determined by an electron lifetime τ of a material ($t_{on}$, $t_{off} \sim \tau$). The electron lifetime τ of the material may decrease due to passivation, i.e., surface treatment, of the material. A carrier lifetime is inversely proportional to the amount of optical power ($P_{opt} \sim 1/\tau$). Therefore, it may be required to increase the amount of optical power and energy consumption so as to reduce a switching time.

Figure 9:
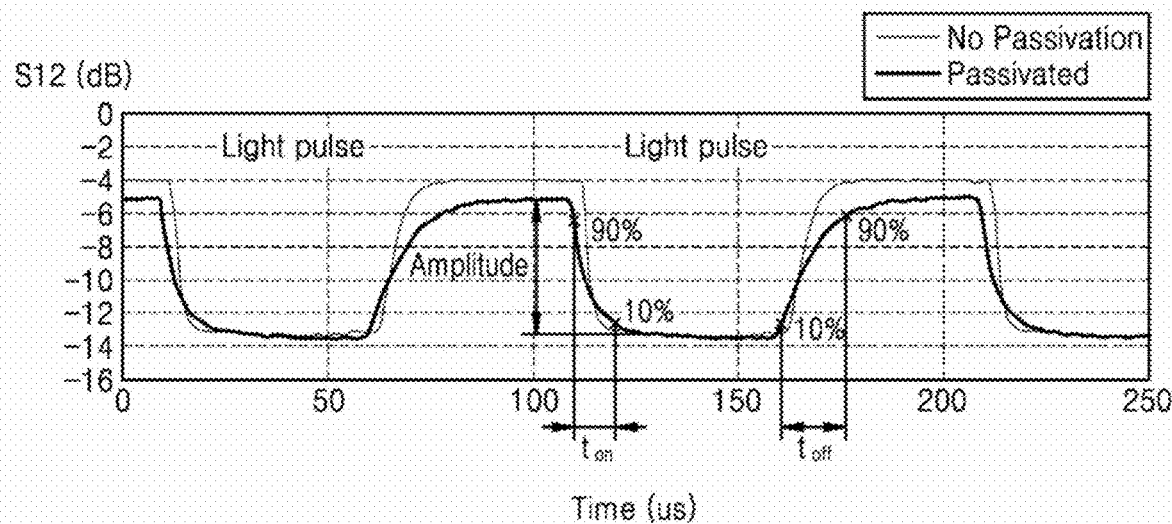
FIG. 9 is a diagram for explaining an effect of passivation in an on/off state of a switch according to an embodiment.

FIG. 9 is a diagram for explaining an effect of passivation in an on/off state of a switch according to an embodiment. In FIG. 9, an on/off time was identified, based on 10% and 90% of supplied power. Table 1 shows an effect of passivation in a material of an opto-switch.

TABLE 1

| Opto-switch material | $t_{on}$, max | $T_{off}$, max |
|---|---|---|
| Passivated silicon | 9.6 | 20.1 |
| Non-passivated silicon | 3.1 | 10.6 |

In the above-described embodiment, an "on" time $t_{on}$ and an "off" time $t_{off}$ may decrease under the following conditions:
 optimization of a photoconductive material (dependent on a carrier lifetime)
 modification of silicon (purity optimization and doping)
 when another material (e.g., gallium-indium arsenide) is used
 optimization of a structure of a switch
 gap control
 when a volume current distribution in the photoconductive material and an electromagnetic edge effect are considered In one embodiment, in order to apply light to a PSE, various modes of an optical supply, including a continuous mode or a pulse mode, may be used. In this case, for example, an LED or a laser diode may be used as a light source.

Figure 10:
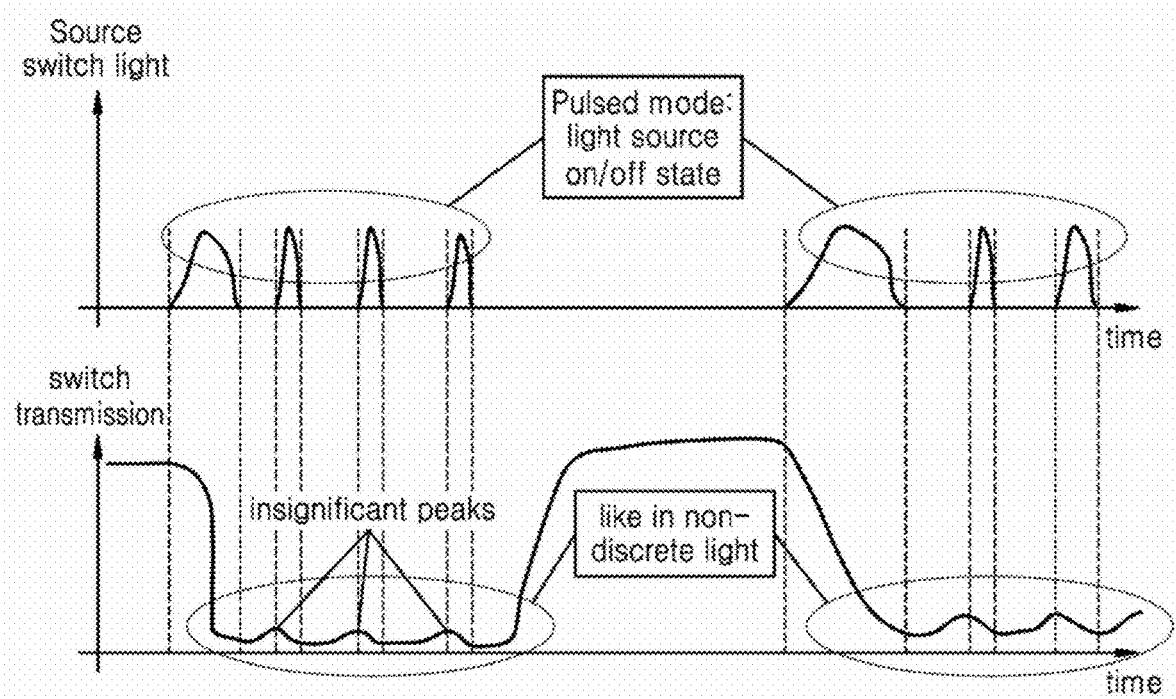
FIG. 10 is a diagram for describing a pulse mode of a light source according to an embodiment.

FIG. 10 is a diagram for describing a pulse mode of a light source according to an embodiment.

In a pulse mode of an optical supply, less optical power is consumed and thus energy may be saved compared to that in a continuous mode. In this case, a duration of a first pulse should be sufficient to set a switch to the "on" state, a cycle of a pulse while the switch is "on" should be shorter than a carrier lifetime of a material of a PSE so that a carrier concentration may not decrease rapidly while a light source is off, and a duration of the pulse should be sufficient to restore to the "on" state.

In one embodiment, the sizes, shapes and locations of the PSE, the light source, a shunt via of an opto-switch, and a printed circuit board may be variously set. Such parameters are variable according to a structure of the printed circuit board, a current flow area for efficient switching, an easy arrangement of elements to be installed, insulation conditions, and the like. The light source may be disposed beyond the center of a semiconductor device or moved to an edge of the semiconductor device. In all such embodiments, a PSE may completely overlap a shunt via and thus may be in contact with a signal layer of the printed circuit board.

In addition, a size, shape, and location of the matching element of the opto-switch may also be set variously and determined according to requirements of an application. FIGS. 11A to 11D are diagrams for describing examples of a matching element.

Figure 11A:
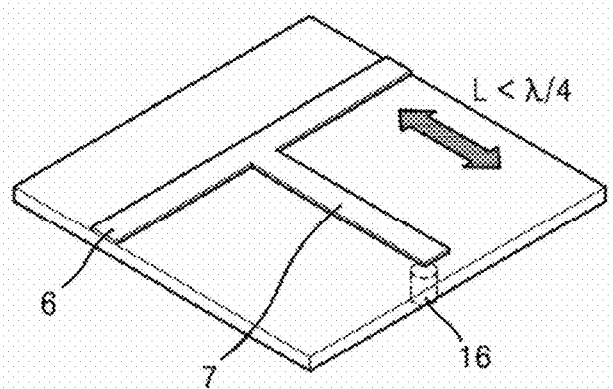
FIG. 11A is a view of a matching element according to an embodiment.

FIG. 11A is a view of a matching element according to an embodiment. Referring to FIG. 11A, when a size of a device is limited, a length of a matching element 7 may be L<$\lambda$/4 and a short via 16 may be located at a far end of the matching element 7.

Figure 11B:
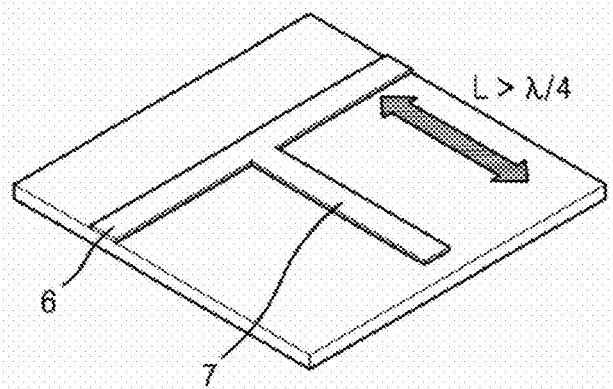
FIG. 11B is a diagram illustrating a matching element according to another embodiment.

FIG. 11B is a diagram illustrating a matching element according to another embodiment. Referring to FIG. 11B, when a size of a matching element 7 is not limited and an operating bandwidth is relatively narrow, the matching element 7 may be provided on a printed circuit board such that a length thereof is L>$\lambda$/4 on a microstrip branch from a point of connection between a microstrip conductor 6 and a shunt via.

Figure 11C:
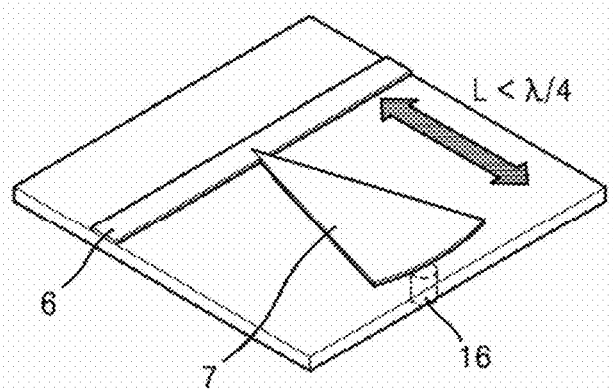
FIG. 11C is a diagram illustrating a matching element according to another embodiment.

FIG. 11C is a diagram illustrating a matching element according to another embodiment. Referring to FIG. 11C, when a size of a device is limited, a length of a matching element 7 may be L<$\lambda$/4 and a short via 16 may be located at a far end of the matching element 7. In one embodiment, when a broadband operation is required, a matching element 7 may have a triangular shape, a vertex of which is positioned at a point of connection between a microstrip conductor 6 and a shunt via.

Figure 11D:
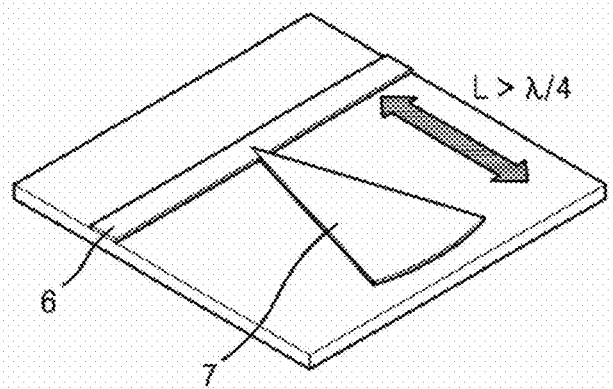
FIG. 11D is a diagram illustrating a matching element according to another embodiment.

FIG. 11D is a diagram illustrating a matching element according to another embodiment. In one embodiment, when a broadband operation is required, a matching element 7 may have a triangular shape, a vertex of which is positioned at a point of connection between a microstrip conductor 6 and a shunt via.

Figure 12:
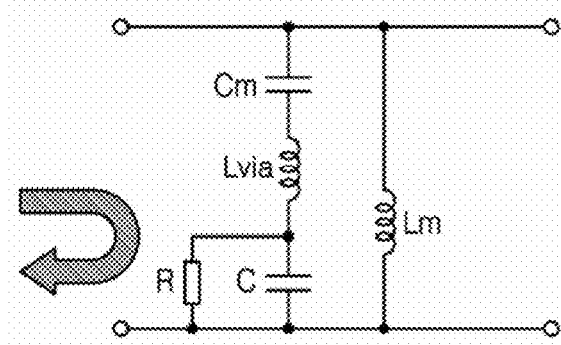
FIG. 12 is a view of an equivalent circuit of an opto-switch with two matching elements according to an embodiment.

FIG. 12 is a view of an equivalent circuit of an opto-switch with two matching elements, according to an embodiment. For improvement of locking characteristics of a switch that is in the "on" state, a switch according to an embodiment has a capacitive characteristic and thus may additionally include an auxiliary matching element to compensate for reactance $L_{via}$ of a shunt via. Referring to FIG. 12, signal blocking may be improved by a matching element $L_m$ and an auxiliary matching element $C_m$.

Figure 13A:
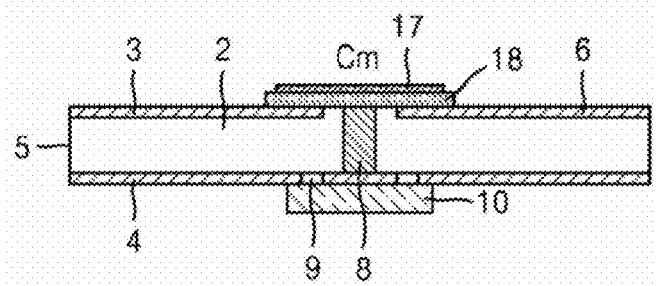
FIG. 13A is a view of an auxiliary matching element according to an embodiment.

FIG. 13A is a view of an auxiliary matching element according to an embodiment. Referring to FIG. 13A, the auxiliary matching element according to the embodiment may be embodied as an additional capacitive plate 17 located outside a signal layer 3 of a printed circuit board 2 and separated from the signal layer 3 through an additional dielectric layer 18. Therefore, an additional capacitance $C_m$ may be formed between the additional capacitive plate 17 and the signal layer 3. In this case, a shunt via 8 may be in contact with the additional capacitive plate 17 instead of the signal layer 3.

Figure 13B:
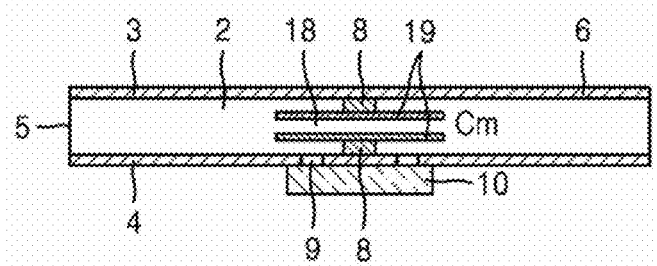
FIG. 13B is a diagram illustrating an auxiliary matching element according to another embodiment.

FIG. 13B is a diagram illustrating an auxiliary matching element according to another embodiment. Referring to FIG. 13B, the auxiliary matching element according to the embodiment may be in the form of a capacitor embedded in a shunt via 8 in a printed circuit board 2. That is, the shunt via 8 according to an embodiment may be provided as a break, and plates 19 of a capacitance $C_m$ may be provided as planes in the break which is parallel to a signal layer 3 and a ground layer 4. In one embodiment, one of the plates 19 may be in contact with the shunt via 8 at one end of the break, and the other plate 19 may be in contact with the shunt via 8 at another end of the break. A dielectric 18 may be located between the plates 19. The auxiliary matching element according to the above-described embodiment may be easy to install, and may be more easily implemented in a multilayer printed circuit board in which capacitor plates may be formed in an intermediate conductive layer.

Various types of devices may be built based on the opto-switch described above. A phase shifter and an antenna will be described as examples below.

Figure 14:
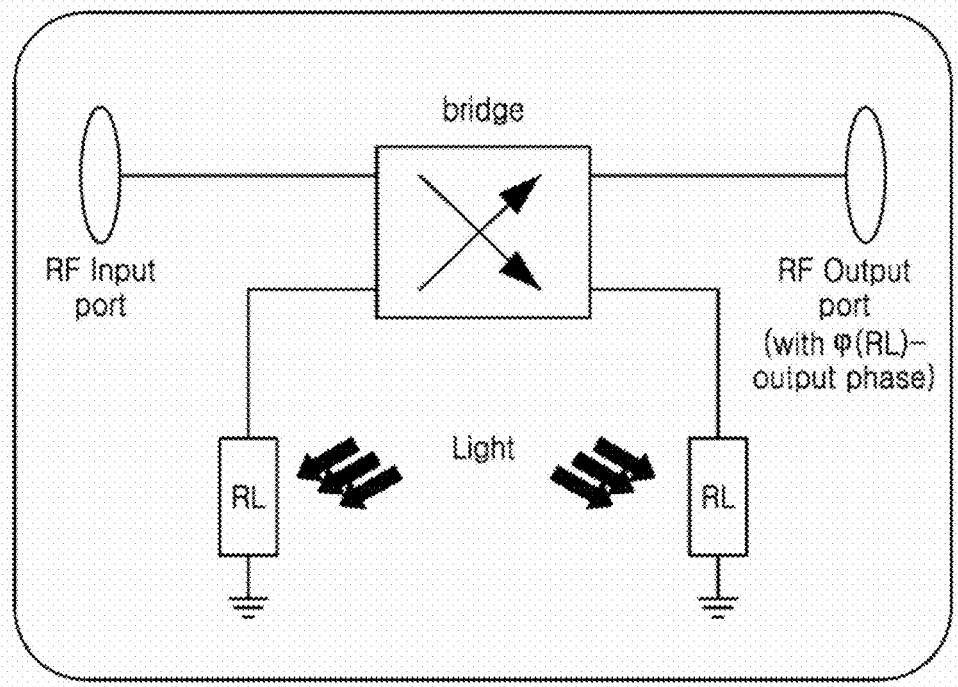
FIG. 14 is a diagram illustrating an opto-switch-based phase shifter according to an embodiment.
Figure 15:
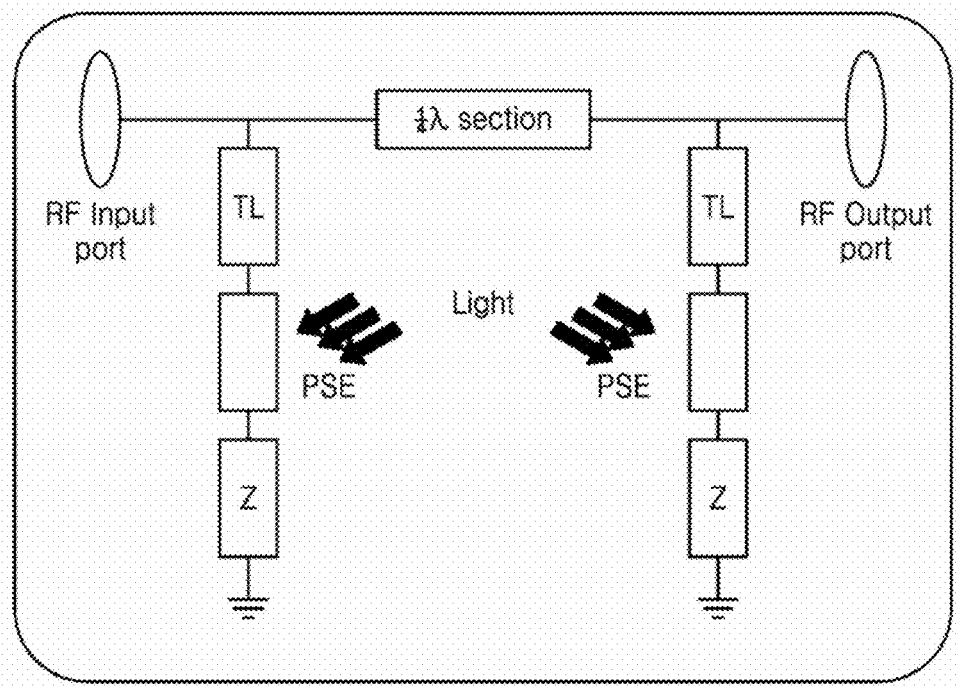
FIG. 15 is a diagram illustrating an opto-switch-based phase shifter according to another embodiment.
Figure 16:
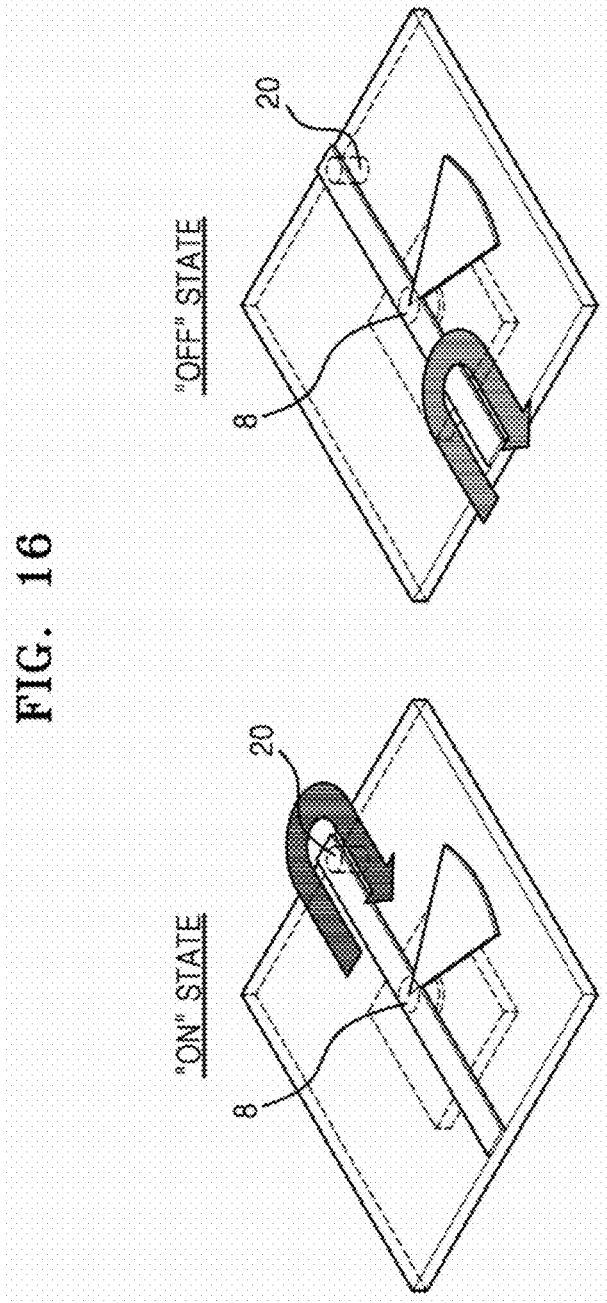
FIG. 16 is a diagram for explaining an operating principle of a reflective load according to an embodiment.

FIGS. 14 and 15 illustrate examples of a phase shifter in which an opto-switch is used as part of a controllable reflective load (RL), according to embodiments. FIG. 16 is a diagram for explaining an operating principle of a reflective load in a phase shifter as described above. A phase shifter according to an embodiment is applicable in various applications in which a control element for controlling an antenna array or phase control is required.

FIG. 14 is a diagram illustrating an opto-switch-based phase shifter according to an embodiment. FIG. 14 illustrates a discrete phase shifter based on a directional coupler (e.g., a 3-dB hybrid coupler/bridge, a 2-branch coupler, a 3-dB rat-race divider, a Lange coupler/bridge or the like. In FIG. 14, the switch may be "off", and a wave may be reflected from an end via connecting an output port of the switch (i.e., an end of a microstrip conductor) to a ground layer of a printed circuit board. When the switch is in the "on" state, a wave may be reflected from a shunt via. When such an RL is used in the phase shifter, it is possible to set a phase change to be in a range of 0° to 360° and to select microstrip-arms of a desired length at a point of connection between a bridge located along a microstrip and a PSE. In this case, in order to calculate a delay time, it may be necessary to apply a magnification of 2 to the difference in length between an end via and the PSE. In FIG. 14, an electrical length of the microstrip and a phase of a reflected signal may be changed by switching. The 3-dB hybrid coupler may convert the phase of the reflected signal into a phase of a transmitted signal, and thus, a small and inexpensive phase shifter may be provided.

FIG. 15 is a diagram illustrating an opto-switch-based phase shifter according to another embodiment. A principle similar to that of the embodiment of FIG. 14 may be applied to the embodiment of FIG. 15. Referring to FIG. 15, when the switch according to the embodiment is on, a wave may be directly reflected from a shunt via. When the switch is off, a wave may be reflected from an end via. In the embodiment of FIG. 15, one end of the ¼ wavelength section of a transmission line may be connected to an input of the phase shifter and another end thereof may be connected to an output of the phase shifter and a second branch. Each branch may include an additional transmission line segment having a transmission line TL, a PSE, and a complex impedance z which are connected in series. In this case, the complex impedance z may be an impedance of the transmission line segment with the end via on a plane of the switch. A required degree of phase change may be determined by a length of all line elements in each branch and a point of connection between photoconductive elements. In the phase shifter using a load as described above according to the embodiment, a phase change may be in a range of 0° to 45°.

FIG. 16 is a diagram for explaining an operating principle of a reflective load according to an embodiment. Referring to FIG. 16, in the embodiments of FIGS. 14 and 15, a switch that is part of a controllable reflective load may be switched between the "on" state and the "off" state to switch reflection of a wave from an input between the end via and the shunt via. Accordingly, a phase of the wave may be changed to a certain degree according to the on/off state of the switch.

Figure 17:
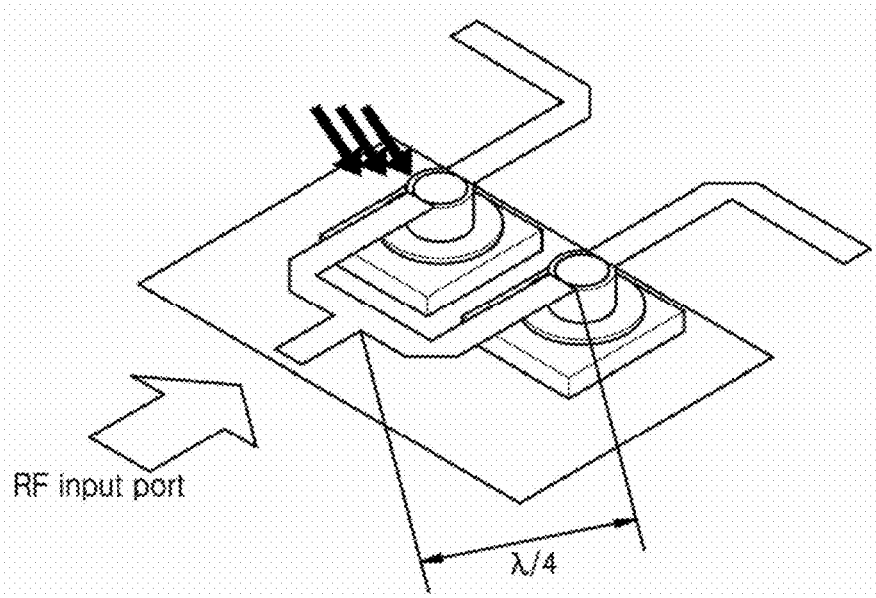
FIG. 17 is a diagram illustrating an opto-switch-based antenna according to an embodiment.

FIG. 17 is a diagram illustrating an opto-switch-based antenna according to an embodiment. FIG. 17 illustrates a radiating dipole cell structure in which an opto-switch is embedded in each arm of a dipole. The distance from an input of the antenna to each opto-switch may be ¼ of a wavelength. A polarity of the dipole may be switched by switching one switch to the "on" state and the other switch to the "off" state or vice versa. The antenna may provide radiation in an end-fire direction.

Figure 18:
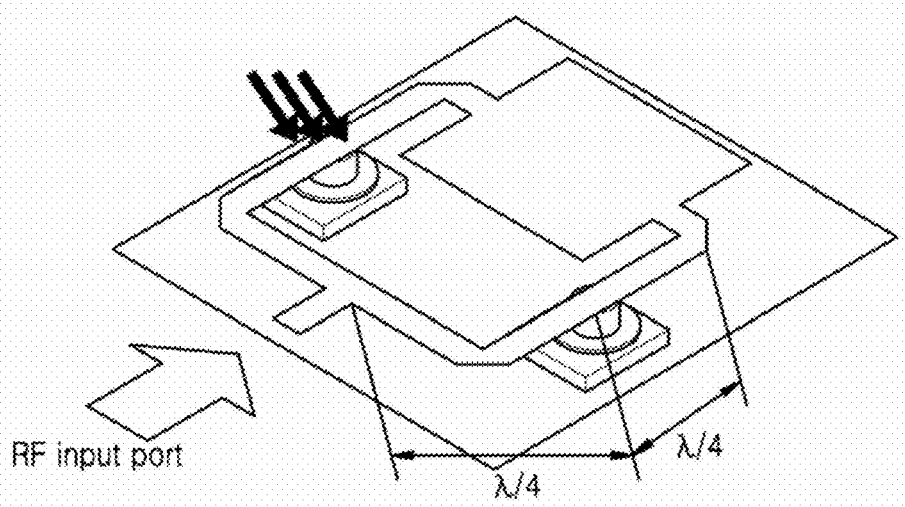
FIG. 18 is a diagram illustrating an opto-switch-based antenna according to another embodiment.

FIG. 18 is a diagram illustrating an opto-switch-based antenna according to another embodiment. FIG. 18 illustrates a radiating patch antenna cell in which an opto-switch is embedded in each arm of a dipole. Similar to the embodiment of FIG. 17, the distance from an input of the antenna to each opto-switch may be ¼ of a wavelength. A polarity of the patch antenna may be switched by switching one switch to the "on" state and the other switch to the "off" state or vice versa. The antenna may provide radiation in the broadband direction.

Figure 19:
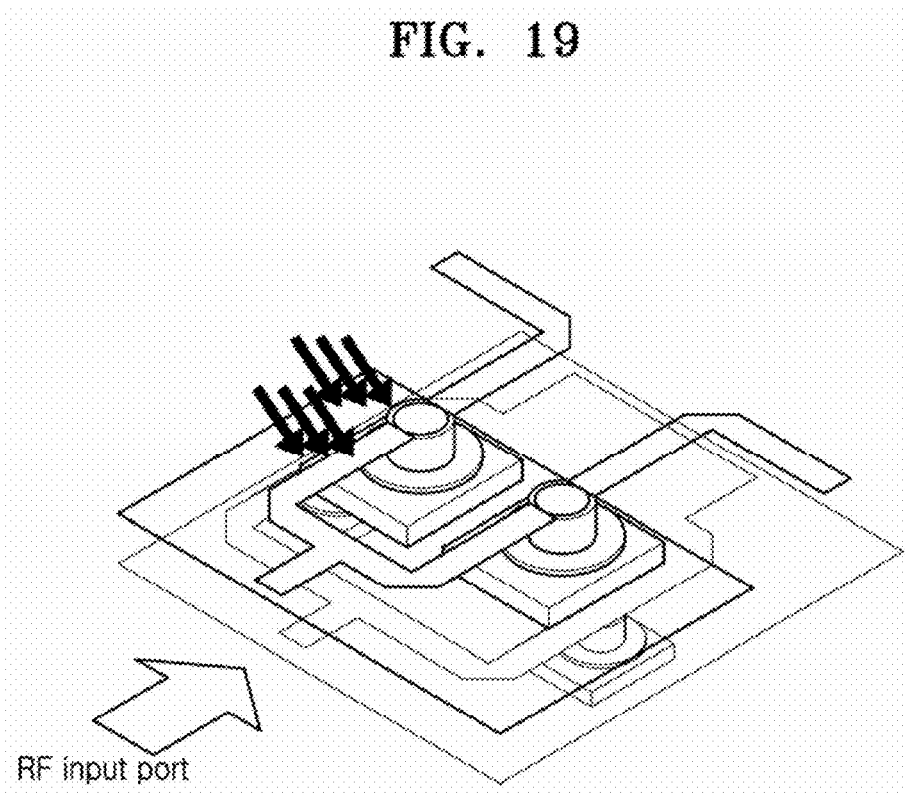
FIG. 19 is a diagram illustrating an opto-switch-based antenna according to another embodiment.

FIG. 19 is a diagram illustrating an opto-switch-based antenna according to another embodiment. The antenna according to the embodiment of FIG. 19 may be a combination of the antennas according to the embodiments of FIGS. 17 and 18. In this case, a multilayer printed circuit board may be used. The antenna of the embodiment of FIG. 19 may provide radiation in both the end-fire direction and the broadband direction.

The opto-switch according to the above-described embodiment is also applicable to a single-pole multi-throw (SPnT) switch.

Figure 20A:
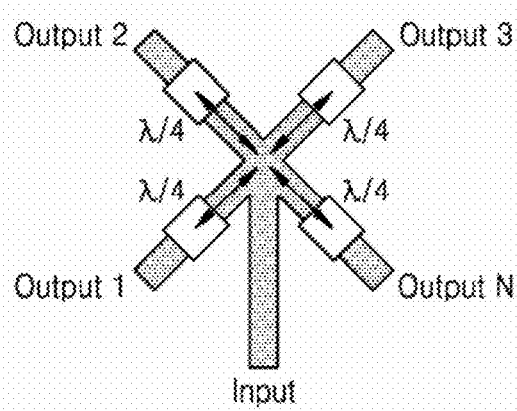
FIG. 20A is a diagram illustrating a single-pole multi-throw switch based on an opto-switch according to an embodiment.
Figure 20B:
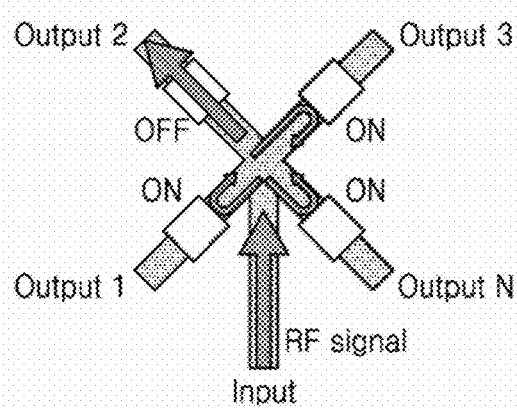
FIG. 20B is a diagram illustrating a single-pole multi-throw switch based on an opto-switch according to another embodiment.

FIGS. 20A and 20B are diagrams illustrating a single-pole multi-throw switch based on an opto-switch according to embodiments. Referring to FIG. 20A, opto-switch elements of a device may be located at a distance λ/4 from an intersection of microstrips connecting an input port and N output ports of the device.

Referring to FIG. 20B, while the device is operating, one of the opto-switch elements may be in the "off" state and the other opto-switch elements may be in the "on" state. In this case, a signal may be transmitted from the input port to an output port in which the opto-switch element is in the "off" state and be reflected from the other opto-switch elements in other "on" state. Therefore, switching between a plurality of RF channels may be controlled using on/off control of an opto-switch element according to an embodiment.

Figure 21A:
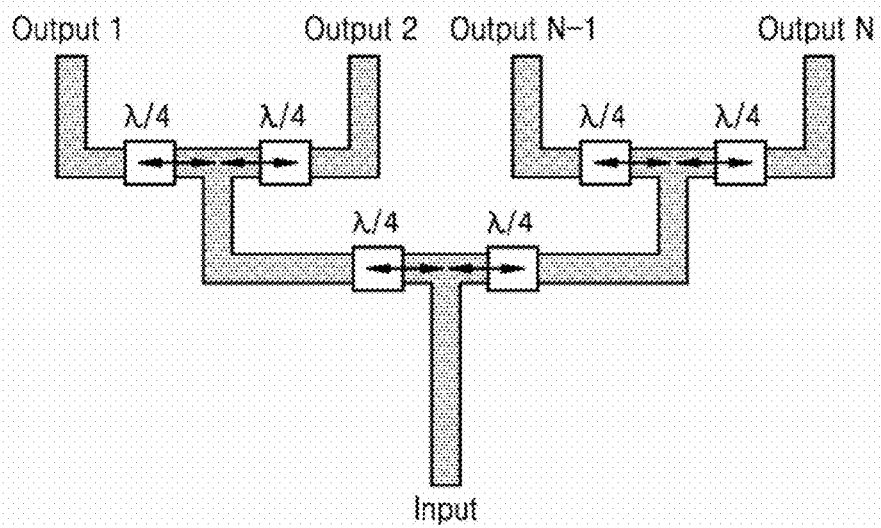
FIG. 21A is a diagram illustrating a multi-throw binary switch based on an opto-switch according to an embodiment.
Figure 21B:
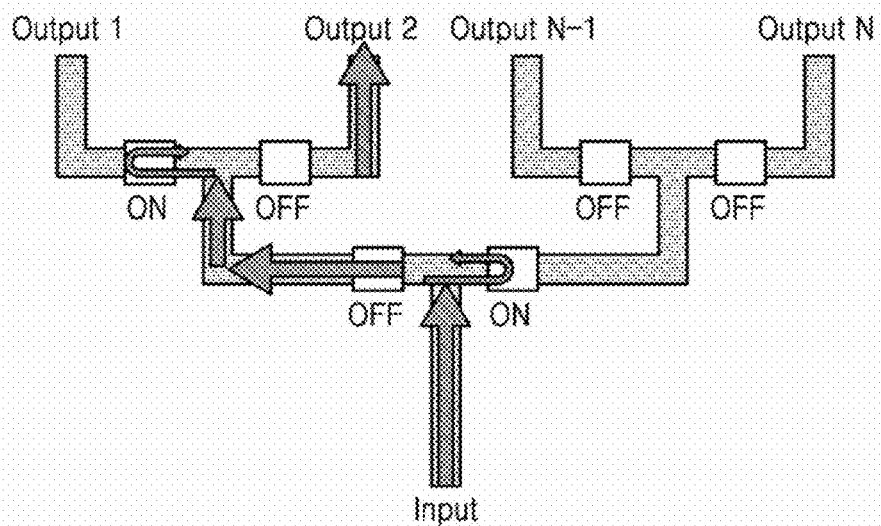
FIG. 21B is a diagram illustrating a multi-throw binary switch based on an opto-switch according to another embodiment.

FIGS. 21A and 21B are diagrams illustrating a multi-throw binary switch based on an opto-switch according to embodiments. Referring to FIG. 21A, each of opto-switch elements of a device may be located on one of arms (branches) of the microstrip power divider, at a distance λ/4 from a junction.

Referring to FIG. 21B, while the device is operating, opto-switch elements located in a path between an input and an desired output are in the "off" state and thus a signal may pass therethrough freely, and the other opto-switch elements are in the "on" state and thus a signal may be reflected therethrough to prevent the signal from reaching the undesired output. Therefore, switching between a plurality of RF channels may be controlled using on/off control of an opto-switch element according to an embodiment.

FIG. 22 is a block diagram of a device for controlling transmission of an electromagnetic wave, e.g., an opto-switch, according to an embodiment. Referring to FIG. 22, a device 100 may include a signal layer 110, a shunt via 120, a photoconductive semiconductor 130, and a ground layer 140. In one embodiment, the device 100 may be formed on a PCB, and the signal layer 110 and the ground layer 140 may be a conductive layer and a ground layer of the PCB, respectively. In this case, a dielectric layer may be positioned between the signal layer 110 and the ground layer 140 to electrically insulate these layers from each other. The dielectric layer may be formed of a material selected from materials with low dielectric loss, sufficient electrical or mechanical strength, thermal conductivity, temperature resistance, chemical resistance, and good machinability. For example, the dielectric layer may be formed of an oxide-based ceramic such as $BaO-TiO_2-MnO_2$ or a mixture of organic materials filled with ceramic.

The signal layer 110 may include a conductor line 111 for propagation of an electromagnetic wave. In one embodiment, the conductor line 111 may be a microstrip transmission line. In one embodiment, the conductor line 111 may allow propagation of an electromagnetic wave from an input terminal of the device 100 to an output terminal thereof.

A first end of the shunt via 120 may be connected to a conductor line and a second end thereof may be connected to the photoconductive semiconductor 130. In one embodiment, the shunt via 120 may be formed in the signal layer 110 toward the ground layer 140 but may not be directly connected to the ground layer 140 and a dielectric gap may be provided between the shunt via 120 and the ground layer 140. In an embodiment, the shunt via 120 may be formed of a material having high conductivity, e.g., a metal.

The photoconductive semiconductor 130 may be connected between the shunt via 120 and the ground layer 140. In one embodiment, the photoconductive semiconductor 130 may have at least two states, e.g., a dielectric state ("off" state) with low intrinsic electrical conductivity because there is no control luminous flux which is an optical signal, and a conducting state ("on" state) with relatively high electrical conductivity because there is control luminous flux. The photoconductive semiconductor 130 may electrically connect the shunt via 120 and the ground layer 140 when an optical signal is input, and may electrically insulate the shunt via 120 and the ground layer 140 from each other when the optical signal is not input.

When the optical signal is not input, an electromagnetic waves may travel from an input port to an output port through the conductor line 111 connecting the input port and the output port. However, when an optical signal is input, the conductor line 111 is electrically connected to the ground layer 140 via the shunt via 120 and the photoconductive semiconductor 130 and thus a state thereof becomes a shunt state. Thus, an electromagnetic wave may be reflected without passing through the shunt via 120. Accordingly, the device 100 may control transmission of an electromagnetic wave by controlling a connection between the conductor line 111 and the ground layer 140, based on an input of an optical signal.

In addition, as described above, in the device 100, the photoconductive semiconductor 130 is not directly connected to the conductor line 111, thereby preventing aging of the circuit and deterioration of performance due to recombination of electrons and the edge effect.

Figure 23:
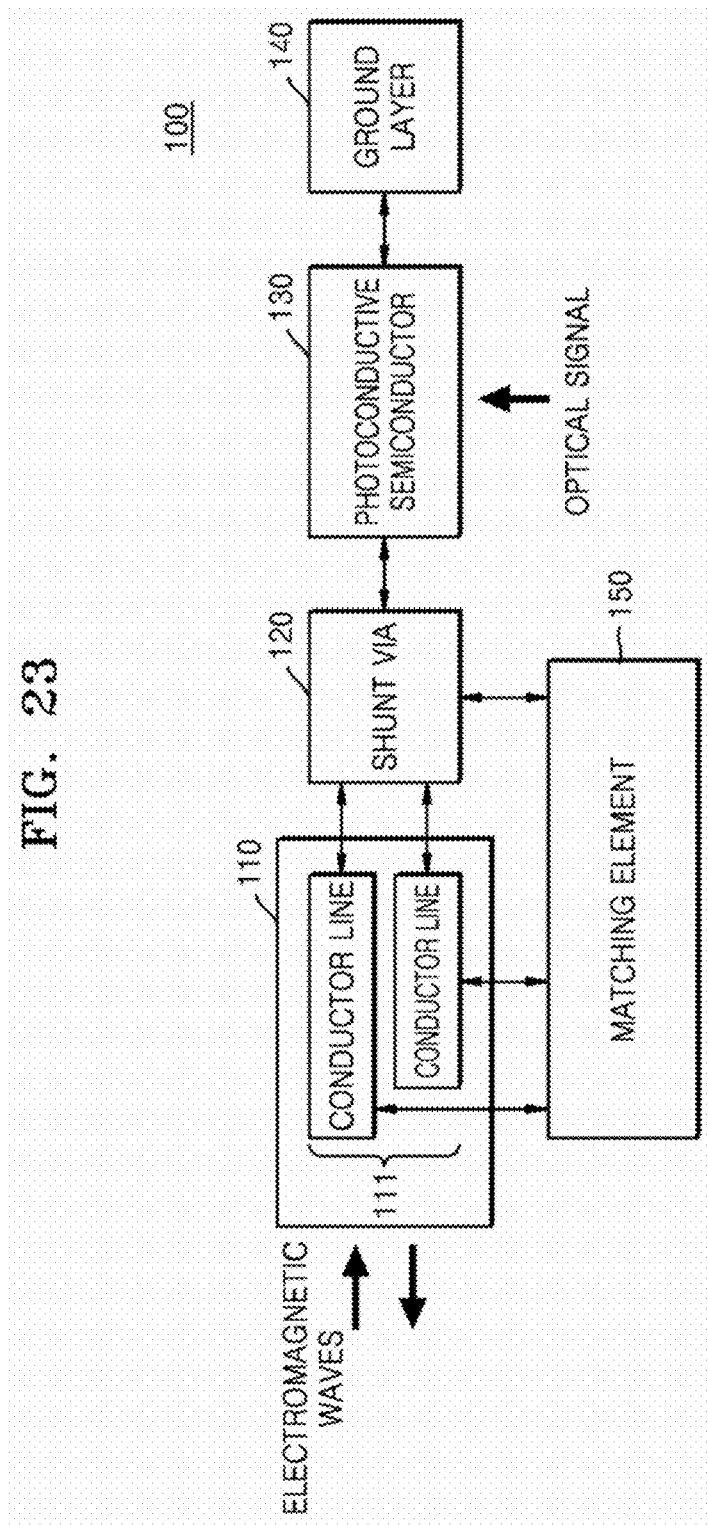
FIG. 23 is a block diagram of a device for controlling transmission of electromagnetic waves, e.g., an opto-switch, according to another embodiment.

FIG. 23 is a block diagram of a device for controlling transmission of an electromagnetic wave, e.g., an opto-switch, according to another embodiment. Referring to FIG. 23, a device 100 may include a signal layer 110, a shunt via 120, a photoconductive semiconductor 130, and a ground layer 140, similar to that of FIG. 22. In one embodiment, the device 100 may be formed on a PCB, and the signal layer 110 and the ground layer 140 may be a conductive layer and a ground layer of the PCB, respectively. In this case, a dielectric layer may be positioned between the signal layer 110 and the ground layer 140 to electrically insulate these layers from each other.

The device 100 may further include a matching element 150 connected to a conductor line 111 and the shunt via 120. In one embodiment, the matching element 150 may include an element having an inductive characteristic in an operating bandwidth of the device 100 to compensate for parasitic capacitance occurring in a dielectric gap between the shunt via 120 and the ground layer 140. In addition, the matching element 150 may include an element having a capacitive characteristic in the operating bandwidth of the device 100 to compensate for reactance of the shunt via 120.

In one embodiment, an inductive element portion of the matching element 150 may be electrically connected to the shunt via 120 and the conductor line 111, and formed on the signal layer 110. The inductive element portion of the matching element 150 may compensate for parasitic capacitance occurring between the shunt via 120 and the photoconductive semiconductor 130 and between the ground layer 140 and the photoconductive semiconductor 130. The parasitic capacitance causes loss of a signal when the photoconductive semiconductor 130 is off, thereby reducing transmission performance. The inductive element portion of the matching element 150 causes an oscillating circuit having a high resistance value in a resonance region in an operating frequency region of the device 100 to be generated. Accordingly, an electromagnetic wave may pass through the device 100 with less loss, thereby dramatically increasing a transmission rate thereof. The inductive element portion of the matching element 150 does not significantly affect reflection performance of an electromagnetic wave when the photoconductive semiconductor 130 is in an on state.

A capacitive element portion of the matching element 150 may compensate for the reactance of the shunt via 120. The reactance of the shunt via 120 decreases reflectance of an electromagnetic wave when the photoconductive semiconductor 130 is in an on state, thereby reducing signal blocking performance. The capacitive element portion of the matching element 150 causes an oscillating circuit to occur in a resonance region in an operating frequency region of the device 100, and thus capacitance connected in series to the reactance of the shunt via 120 in an equivalent circuit may be formed, thereby improving signal blocking performance.

In one embodiment, the capacitive element portion of the matching element 150 may be in the form of a conductive pad positioned to be separated by an additional dielectric layer outside the signal layer 110. In this case, the shunt via 120 may not be in contact with the signal layer 110.

In one embodiment, the shunt via 120 may be formed to include a break, and the capacitive element portion of the matching element 150 may be in the form of a capacitor embedded in the shunt via 120 and may be embodied as planes located in the break to be parallel with the signal layer 110 and the ground layer 130. In this case, one of the planes may be in contact with the shunt via 150 at one of the break and the other plane may be in contact with the shunt via 150 at another end of the break.

FIG. 24 is a flowchart of a method of controlling transmission of an electromagnetic wave, according to an embodiment. Referring to FIG. 24, in operation S1010, a device may receive an electromagnetic wave through an input end of a conductor line on a signal layer. The received electromagnetic wave may travel through a conductor line.

In operation S1020, the device may receive an optical signal via a photoconductive semiconductor, which is in the dielectric state or the conducting state, based on an input of the optical signal. In one embodiment, the optical signal may be provided from a light source, including an LED. In one embodiment, the optical signal may be provided in the form of a pulse, and a length of the pulse may be determined by the size, material, and dielectric characteristics of the photoconductive semiconductor.

In operation S1030, the conductor line may be electrically connected to a ground layer, which is electrically separated from a signal layer through a dielectric layer and is electrically grounded, through a photoconductive semiconductor and a shunt via connected to the photoconductive semiconductor, based on the input of the optical signal. For example, when the photoconductive semiconductor is turned on based on the optical signal, the conductor line may be electrically connected to the ground layer. On the other hand, when the photoconductive semiconductor is off, the conductor line may be electrically insulated from the ground layer.

In operation S1040, an electromagnetic wave may be reflected from the shunt via, based on the input of the optical signal. In one embodiment, when the photoconductive semiconductor is turned on based on the optical signal, the conductor line is electrically connected to the ground layer and thus the electromagnetic wave may be reflected from the shunt via. On the other hand, when the photoconductive semiconductor is off, the conductor line is electrically insulated from the ground layer and thus the electromagnetic wave may travel along the conductor line from an input end of the conductor line to an output end thereof.

As used herein, the broadband direction may refer to a direction perpendicular to a plane of a device (e.g., a communication device), and the end-fire direction may refer to a direction parallel to a plane, e.g., a display plane, of the device.

A photoconductive element using an opto-switch according to an embodiment of the present disclosure, e.g., optimized beamforming generation based on, for example, a strip line, a circulator, a phase shifter, a switch, an antenna or the like, is applicable to electronic devices for which RF signal control is required, e.g., millimeter-band 5G mobile networks, Wireless Gigabit Alliance (WiGig) advanced standards, various types of sensors, and Wi-Fi networks, wireless power transmission such as long-distance wireless power transmission, and smart systems having various millimeter wave compatibilities such as smart form systems, vehicle navigation, Internet of Things (IoT) and wireless payment.

In particular, when the opto-switch according to an embodiment is used for wireless power transmission, an antenna array of multiple emitters connected to a control circuit through separate opto-switches may be used. In this case, the control circuit may control turning on or off of the switches in the form of a diffraction grating. A transmission antenna according to the embodiment as described above may have improved directivity over a wide range of angles.

When an opto-switch according to the embodiment is used in robotics, an antenna may be used to detect or avoid an obstacle. Because the antenna using the opto-switch according to the embodiment has variable directivity over a wide range, a device is capable of easily predicting an obstacle.

An opto-switch according to an embodiment is also applicable to an antenna of a 5G base station. Because an antenna using the opto-switch according to the embodiment has variable directivity over a wide range and provides a wide range of usable distances, the antenna is capable of efficiently transmitting and receiving signals according to communication characteristics.

According to an embodiment of the present disclosure, a computer-readable medium storing a computer program for operating the above-described methods may be provided. In addition, the content of all papers and documents submitted concurrently with or prior to the present specification in connection with the present disclosure and published in the present specification may be included as reference.

The computer described herein may be implemented with hardware components, software components, and/or a combination of hardware components and software components. For example, the devices and components described in the embodiments may be implemented using one or more general-purpose computers or special-purpose computers, e.g., a processor, a controller, an arithmetic logic unit (ALU), a digital signal processor, a microcomputer, a field-programmable array (FPA), a programmable logic unit (PLU), a microprocessor, or any other devices capable of executing and responding to instructions.

Although embodiments have been described above in conjunction with the limited number of embodiments and the drawings, various modifications and modifications can be made from the above description by those of ordinary skill in the art. For example, an appropriate result may be achieved even when the above-described techniques are performed in an order different from that described herein and/or the above-described components such as a system, a structure, a device, and a circuit, are combined in a form different from that described herein or replaced with other components.

Therefore, the scope of the present disclosure is not limited to the embodiments described herein and should be defined by the claims and their equivalents.

The invention claimed is:

1. A device for controlling transmission of electromagnetic waves, the device comprising:
    a conductor line which is positioned on a signal layer and along which electromagnetic waves received via an input terminal travels;
    a ground layer electrically separated from the signal layer through a dielectric layer and electrically grounded;
    a shunt via including a first end and a second end and connected to the conductor line through the first end; and
    a photoconductive semiconductor which is connected between the second end of the shunt via and the ground layer, and is in a dielectric state or a conducting state, based on an input of an optical signal,
    wherein the conductor line is electrically connected to the ground layer through the photoconductive semiconductor in the conducting state, and the shunt via, thereby causing reflection of electromagnetic waves from the shunt via.

2. The device of claim 1, wherein the device is provided using a printed circuit board, and
    the signal layer comprises a conductive layer of the printed circuit board, and the ground layer comprises a ground layer of the printed circuit board.

3. The device of claim 1, wherein the optical signal comprises a pulse signal,
    wherein the pulse signal comprises a first pulse for setting the photoconductive semiconductor to the conducting state and a second pulse having a period shorter than a carrier lifetime of the photoconductive semiconductor.

4. The device of claim 1, further comprising a matching element configured to form a resonance circuit in a driving frequency band of the device.

5. The device of claim 4, wherein the matching element comprises an inductive element configured to compensate for parasitic capacitance between the shunt via and the ground layer.

6. The device of claim 5, wherein the inductive element is connected to the conductor line and the shunt via and provided on the signal layer.

7. The device of claim 6, wherein the inductive element is provided in a shape of a triangle with a vertex positioned at a point of connection of the conductor line and the shunt via.

8. The device of claim 4, wherein the matching element comprises a capacitive element electrically connected to the shunt via and configured to compensate for reactance of the shunt via.

9. The device of claim 8, further comprising an additional dielectric layer outside the signal layer,
    wherein the capacitive element is provided in the form of a conductive pad connected to the signal layer and the shunt via through the additional dielectric layer.

10. The device of claim 8, wherein the capacitive element is provided in the form of a capacitor embedded in the shunt via.

11. The device of claim 4, further comprising a microstrip branch configured to connect the conductor line and the shunt via,
    wherein the matching element is located on the microstrip branch and the location of the matching element is determined based on a wavelength of the electromagnetic waves.

12. A phase shifter which includes a device for controlling transmission of electromagnetic waves, the phase shifter comprising:
    a conductor line which is positioned on a signal layer and connected to an input terminal and an end via, and along which electromagnetic waves received through the input terminal travel toward the end via;
    a ground layer electrically separated from the signal layer through a dielectric layer and electrically grounded;
    a shunt via including a first end and a second end and connected to the conductor line through the first end; and
    a photoconductive semiconductor which is connected between the second end of the shunt via and the ground layer, and is in a dielectric state or a conducting state, based on an input of an optical signal, wherein the conductor line is electrically connected to the ground layer through the photoconductive semiconductor in the conducting state and the shunt via, thereby causing reflection of electromagnetic waves from the shunt via.

13. The phase shifter of claim 12, wherein the conductor line is electrically insulated from the ground layer through the photoconductive semiconductor in the dielectric state, thereby causing reflection of electromagnetic waves from the end via.

14. The phase shifter of claim 13, wherein the phase shifter is provided using a printed circuit board, and the signal layer comprises a conductive layer of the printed circuit board, and the ground layer comprises a ground layer of the printed circuit board.

15. The phase shifter of claim 12, wherein the optical signal comprises a pulse signal, wherein the pulse signal comprises a first pulse for setting the photoconductive semiconductor to the conducting state and a second pulse having a period shorter than a carrier lifetime of the photoconductive semiconductor.

\* \* \* \* \*